United States Patent [19]
Mizutani

[11] Patent Number: 5,757,505
[45] Date of Patent: May 26, 1998

[54] EXPOSURE APPARATUS

[75] Inventor: Hideo Mizutani, Yokohama, Japan

[73] Assignee: Nikon Corporation, Tokyo, Japan

[21] Appl. No.: 800,062

[22] Filed: Feb. 14, 1997

[30] Foreign Application Priority Data

Feb. 16, 1996 [JP] Japan ............................ 8-029301
Aug. 6, 1996 [JP] Japan ............................ 8-207102

[51] Int. Cl.$^6$ ............................................ G01B 11/00
[52] U.S. Cl. ............................................ 356/400; 356/401
[58] Field of Search .......................... 356/399–401,
356/152, 373, 375, 237, 338, 349; 250/548,
204, 572, 563, 561, 571, 202, 225, 226

[56] References Cited

U.S. PATENT DOCUMENTS

| | | | |
|---|---|---|---|
| 4,870,289 | 9/1989 | Sato et al. | 356/400 |
| 4,870,452 | 9/1989 | Tanimoto et al. | 356/400 |
| 5,572,288 | 11/1996 | Mizutani | 356/400 |

FOREIGN PATENT DOCUMENTS 1-212436  8/1989  Japan .
4-82175  12/1992  Japan .

*Primary Examiner*—David C. Nelms
*Assistant Examiner*—Michael P. Stafira
*Attorney, Agent, or Firm*—Morgan, Lewis & Bockius LLP

[57] ABSTRACT

In order to measure an image formation characteristic of a projection optical system directly and continuously without using a substrate to be replaced during a step for exposure a reticle, a wafer or the like, a reference unit, on which a reference mark is formed, is disposed between the projection optical system and the wafer. In a measuring optical system, diffracted light obtained by irradiating laser beam onto a diffraction grating on a measuring reference plate is irradiated onto a reference mark on the reference unit through a modulator and the projection optical system. Interference light generated from the reference mark is received by a photoelectric sensor through the projection optical system. A variation quantity of a focus position of the projection optical system is obtained from a phase difference of a detection signals output from the photoelectric sensor. A variation quantity of a projection magnification is obtained from an average of the phases of the detection signals.

26 Claims, 8 Drawing Sheets

EXPOSURE APPARATUS

BACKGRUND OF THE INVENTION

1. Field of the Invention

The present invention relates to an image formation characteristic measuring device of a projection optical system and an exposure apparatus equipped therewith, which are used for transcribing a mask pattern onto a photosensitive substrate, during photolithography process to manufacture, e.g. a semiconductor device, an image pick-up device (such as CCD), a liquid crystal display element, a thin film magnetic head and the like.

2. Related Background Art

A projection exposure apparatus such as a stepper has been used on manufacturing, e.g. a semiconductor device, which transribes and exposes, through a projection optical system, a reticle pattern as a mask onto each shot region on a wafer coated with photoresist. For the projection exposure apparatus, in order to transcribe the reticle pattern image to the each shot region on the wafer precisely, the projection exposing operations must be conducted, under the situation where the surface of the wafer is focused on the focal position, such as a position in an optical axis direction, of an image formation plane in the projection optical system and the projection magnification of the projection optical system is kept at a predetermined value.

However, even though image formation characteristics of the projection optical system such as the focal position and the projection magnification is set at the predetermined value at an initial state, it has been known that the image formation characteristics changes gradually, due to the factors such as variations in atmospheric pressure and a setting temperature of an air conditioner, and due to the factors such as a thermal expansion of optical components in the projection optical system resulting from continuous irradiation of exposure illumination light. The variations in the image formation characteristics has, heretofore, been detected and inferred in the following manner.

(1) Indirect Estimation Method

This method is conducted in such manner that the variations in the image formation characteristics are indirectly estimated based on the monitoring result of an irradiation quantity of the exposure illumination light and based on the variation of the monitoring result of the atmosphere, without executing direct measurement of the variations in the focal position of the image plane and the projection magnification in the projection optical system. According to the variations inferred in such manner, the image formation characteristics are kept at a predetermined state, by controlling either a pressure in a gas chamber between the predetermined lenses in the projection optical system or the positions and inclinations of the predetermined lenses therein by the so called open-loop controlling. The mechanism for controlling the pressure in the gas chamber and the positions of the predetermined lenses in the projection optical system has been known as a lens controller.

(2) Method Disclosed in Japanese Patent Publication No. 4-82175

This method is conducted in such manner that the quantity of the positional shifting of the reference mark formed on the reticle from the reference mark formed on the wafer is detected through the projection optical system using detection light other than the exposure illumination light, whereby the quantity of the variations in the projection magnification of the projection optical system is directly detected from the detection results.

(3) Method Disclosed in Japanese Patent Appln. Laid-Open No. 1-212436

This method is conductedinthe followingmanner. Using a detection light different other than the exposure illumination light, through the projection optical system, detected is the quantity of the positional shifting of the reticle side reference mark, which is formed on the reticle, from the wafer side reference mark arranged between the projection optical system and the wafer. The quantity of the variations in the image formation characteristics such as the projection magnification of the projection optical system is directly detected from the detection results.

For the above described conventional art, (1) in the method in which the quantity of the variations of the image formation characteristics of the projection optical system is indirectly estimated from the monitoring result of the irradiation quantity of the illumination light and the pressure of the atmosphere, the variation quantity of the image formation characteristics can be estimated also during an exposure operation. However, since the variation quantity of the image formation characteristics of the projection optical system is not directly measured, the correction precision for the image formation characteristics may be deteriorated. Moreover, when the data as to the course happens to be lost because of stop of the computer operation in the control system during monitoring the course of the irradiation quantity, an initializing operation to wait until the temperature of the projection optical system becomes equal to approximately a room temperature is required. Therefore, a thoroughput which means the number of treated wafers per unit time in the exposure step reduces.

Next, (2) in the method in which the variation quantity of the projection magnification of the projection optical system is directly detected, an objective to be detected is the reference mark on the wafer, so that measurement is impossible during the exposure operation is actually performed on the wafer. Therefore, a correction precision for the projection magnification may be deteriorated. Furthermore, a measurement operation interrupts the exposure operation, there has been a drawback of reduction of the throughput.

On the other hand, (3) in the method in which the variation quantity of the image formation characteristics is detected based on the positional shifting quantity of the reference mark on the reticle from the reference mark disposed between the projection optical system and the wafer, there is a merit that measurement is possible during the exposure operation is conducted on the wafer. However, the position of each reference mark on the reticle is subtly out of that on other reticles, requiring calibration every time the reticle is replaced with others. Therefore, there is a drawback in this method that throughput reduces. Moreover, particularly when the reticle having a large circuit pattern portion is used, the reticle causes thermal expansion resulting from absorption of irradiation heat from the exposure illumination light. Therefore, an error of the detection result of the image formation characteristic sometimes occurs because of the positional shifting quantity between the reference marks.

Furthermore, in recent years, scan type projection exposure apparatuses have received much attentions, which employ a step-and-scan method in which the pattern on the reticle is sequentially transferred and exposed onto each shot region on the wafer by scanning the reticle and the wafer synchronously relative to the projection optical system. In such scan type projection exposure apparatus, the reticle moves during the exposure operation. Therefore, if the reference mark is formed on the reticle, measurement of the

3 image formation characteristic will be difficult during the exposure onto the wafer.

SUMMARY OF THE INVENTION

The object of the present invention is to provide an image formation characteristic measurement apparatus which is capable of directly and continuously measuring an image formation characteristic such as a focal position and a projection magnification without usage of a substrate such as a mask (reticle) and a photosensitive substrate (wafer) which are to be replaced during an exposure step.

Another object of the present invention is to provide an exposure apparatus comprising such image formation characteristic measurement apparatus, which is capable of transferring a mask pattern onto the photosensitive substrate through the projection optical system with a high precision.

The object of the present invention is to provide an image formation characteristic measurement apparatus which is capable of directly and continuously measuring an image formation characteristic such as a focal position and a projection magnification without usage of a substrate such as a mask (reticle) and a photosensitive substrate (wafer) which are to be replaced during an exposure step, and which is capable of precisely measuring the image formation characteristics even when the substantial numerical aperture of imaging beam changes.

Another object of the present invention is to provide an exposure apparatus comprising such image formation characteristic measurement apparatus, which is capable of transferring a mask pattern onto the photosensitive substrate through the projection optical system with a high precision.

In an image formation characteristic measurement apparatus measuring an optical characteristic as to a projection optical system (PL) which projects an original pattern image formed on a mask (R) onto a photosensitive substrate (W), the improvement comprises a substrate side reference unit (12) disposed between the projection optical system (PL) and the substrate (W), on which a substrate side reference mark (14A) is formed; a measuring reference unit (17) disposed on a predetermined reference plane (P1) which is located at a position separate from the mask (R), on which a measuring reference mark (17a) is formed; and a measuring optical system (15) for detecting the substrate side reference mark (14A) through the measuring reference unit (17) and the projection optical system (PL) with a predetermined detection light, in order to measure the image formation characteristic of the projection optical system (PL).

When image formation characteristics of the projection optical system (PL) such as a focal position and a projection magnification changes due to the changes of environmental conditions such as temperature and atmospheric pressure, the states of light beam passing through the projection optical system (PL) also changes in response to these changes. According to the present invention, the relative positions of the substrate side unit (12) and the measuring reference unit (17) to the projection optical system (PL) and the structures of these reference units (12, 17) are substantially unchangeable, whereby the measuring optical system (15) is allowed to directly detect the variation quantity of the image formation characteristic by detecting the substrate side reference mark (14A) through the projection optical system (PL). Moreover, these reference units (12, 17) exist independently from the mask and the substrate, so that the continuous detection of the image formation characteristic is possible even during the exposure operation, thereby preventing a reduction in throughput.

4

The measuring optical system of the present invention is, for example, constituted such that after a predetermined detection light is irradiated onto the substrate side reference mark (14A) through the measuring reference unit (17) and the projection optical system (PL), at least one interference light emitted from the substrate side reference mark (14A) is received, for example, through the projection optical system (PL). The image formation characteristic of the projection optical system (PL) is measured based on the phase of at least one interference light received by the measuring optical system. This implies that the measuring optical system adopts either a homodyne interference method or a heterodyne interference method.

Furthermore, the measuring optical system of the present invention should operate in the following manner. Specifically, the measuring optical system receives two interference lights emitted from the substrate side reference mark (14A) in the substrate side reference unit (12), and obtains the shifting quantity of the focus position of the image formation plane of the projection optical system (PL) from the phase difference between the two interference lights. Further, the measuring optical system obtains the horizontal shifting quantity of the projected image (projection magnification, variation quantity of distortion) by the projection optical system (PL) from the average of the phases of the two interference lights.

In this case, at the time of obtaining the shifting quantity of focus position, the formation plane of the substrate side reference mark (14A) should be set on the plane approximately conjugated with the surface of the substrate (W). Moreover, the substrate side reference marks (14A, 14B) measured in the radius direction (meridional direction) relative to the optical axis of the projection optical system (PL) are previously formed on the substrate side reference unit (12), whereby the variation quantity of the projection magnification of the projection optical system (PL) can be detected.

Furthermore, the measuring optical system is constituted such that a plurality of diffracted lights ($L_0$, $L_1$, $L_{-1}$) generated from the measuring reference mark (17a) by irradiating the predetermined detection light onto the measuring reference mark (17a) on the measuring reference unit (17) are irradiated onto the substrate side reference mark (14A) on the substrate side reference unit (12). In this case, scanning means (20) for scanning the plurality of the diffracted lights onto the substrate side reference mark (14A) should be provided. The provision of the scanning means (20) copes with the necessity to relative movements of the substrate side reference mark (14A) and the detection light by some means in order to measure the phase of the interference light.

Next, in an exposure apparatus which projects an original pattern image formed on a mask (R) onto a photosensitive substrate (W) through a projection optical system (PL), the improvement comprises a substrate side reference unit (12) disposed between the projection optical system (PL) and the substrate (W), on which a substrate side reference mark (14A) is formed; a measuring reference unit (17) disposed on a predetermined reference plane (P1) which is located at a separate position from the mask (R), on which a measuring reference mark (17a) is formed; a measuring optical system (15) for detecting the substrate side reference mark (14A) through the measuring reference unit (17) and the projection optical system (PL) using a predetermined detection light, in order to measure an image formation characteristic of the projection optical system (PL); and image formation characteristic correction means (10, 28) for correcting the image formation characteristic of the projection optical system (PL) based on detection results of the measuring optical system.

According to the exposure apparatus of the present invention, for example, when the change of the focus position of the image formation plane of the projection optical system (PL) is detected, the substrate (W) is moved up and down through the stage (10) on the substrate side serving as the image formation correction means, whereby auto-focusing is conducted. Moreover, for example, when the change of the projection magnification is detected, the projection magnification is corrected through the lens controller (28) that is an example of the image formation characteristic correction means. In addition, the image formation characteristic may be corrected by changing environment.

In this case, the measuring optical system is constituted such that after a predetermined detection light is irradiated onto the substrate side reference mark (14A) through the measuring reference unit (12) and the projection optical system (PL), the measuring optical system receives at least one interference light emitted from the substrate side reference mark (14A), for example, through the projection optical system (PL). In accordance with the image formation characteristic of the projection optical system (PL) which is measured based on the phase of the interference light received by the measuring optical system, the image formation characteristic of the projection optical system (PL) should be corrected through the image formation characteristic correction means (28).

In an image formation characteristic measurement apparatus of a projection optical system (PL) which projects an original pattern image formed on a mask (R) onto a photosensitive mask (W), the improvement comprises a substrate side reference unit (12) disposed between the projection optical system PL) and the substrate (W) on which a substrate side reference mark (14A) is formed; a measuring reference unit (17) disposed on a predetermined reference plane (17a) which is located at a separate position from the mask (R); angle scanningmeans (19, 19D) forperforming angle scanning on light beam from the measuring reference unit within an effective aperture; and a measuring optical system (15) which, in order to measure an image formation characteristic of the projection optical system (PL), detects the substrate side reference mark (14A) through the projection optical system (PL) using detection light ($L_1$, $L_{-1}$) which is subjected to the angle scanning by the angle scanning means (19, 19D) after passing through the measuring reference unit (17).

According to the present invention, when the image formation characteristic such as a focus position of an image formation plane and a projection magnification in the projection optical system (PL) changes because of environmental changes such as temperature and atmospheric pressure, the state of the light beam passing through the projection optical system (PL) also changes in accordance with the change of the image formation characteristic. On the other hand, since the relative positions of the substrate side reference unit (12) and measuring reference unit (17) with respect to the projection optical system (PL) and the structures of them are made to be substantially unchangeable in spite of the environmental changes, the variation quantity of the image formation characteristic of the projection optical system (PL) can be directly detected by detecting the substrate side reference mark (14A) through the projection optical system (PL) in the measuring optical system (15) Moreover, these reference units (12, 17) are independent from the mask and the substrate, whereby the continuous detection for the image formation characteristic can be carried out during the exposure operation. Therefore, no reduction in throughput will brought about.

In this case, an acousto-optic modulator generating a pair of interferable light beames ($L_1$, $L_{-1}$) each having different frequency, is used as the measuring reference unit (17). The surface of the substrate side reference unit (12) where the substrate side reference mark (14A) is formed is made approximately conjugated with the surface of the substrate (W). As shown in FIG. 12A, a crossing (42) of the pair of the light beames ($L_1$, $L_{-1}$) from the measuring reference unit (17) are set on the substrate side reference mark (14A), and the pair of the light beames are scanned in a angle direction in a plane including the pair of the light beames by the angle scanning means (19, 19D), the scanning being performed centering the crossing (42) or the conjugate point, whereby the detection light ($L_c$) composed of a pair of diffracted lights emitted from the substrate side reference mark (14A) in the same direction is received. Then, based on the shifting quantity of the phase of the detection light from the phase of a predetermined reference signal, the positional shifting quantity of the substrate side reference mark (14A), that is, the positional shifting quantity of the substrate side reference mark (14A) against the light beam from the measuring reference unit (17) is detected. Its reference signal is generated from driving signals, for example, from the acousto-optic modulator.

At this time, as shown in FIG. 12A, when the focus position of the image formation plane of the image formation optical system (PL) is unchangeable, its positional variation quantity makes no change by the angle scanning for the pair of the light beames. On the other hand, the focus position of the image formation plane moves, and, as shown in FIG. 12B, the crossing (42) of the pair of the light beames changes its position relative to the formation plane of the substrate side reference mark (14A). In such situation, when the pair of the light beames are subjected to the angular scanning, the positional shifting quantity of the substrate side reference mark (14A) with respect to the light beam from the measuring reference unit (17) changes according to the scanning angle. By measuring the positional shifting quantity, the defocusing quantity of the image formation plane is detected. Furthermore, when the substrate side reference mark (14A) is formed so as to include the component in the meridional direction, i.e., in a radius vector direction viewed from the optical axis of the projection optical system, a magnification error of the projection optical system (PL) or a lateral shifting quantity of the projected image is detected from a lateral shifting quantity of the substrate side reference mark (14A) from the light beam, which is emitted from the measuring reference unit (17).

Furthermore, in the case where the tilt angle distribution of the image light beam, which is incident into the projection optical system (PL) from the mask (R), changes according to such as line widths of the transfer pattern on the mask (R) and the numerical aperture of the image light beam passing through the projection optical system (PL) substantially changes, the angle of incidence of the light beam relative to the substrate side reference mark (14A) is controlled, which is incident on the substrate side reference mark (14A) from the measuring reference unit (17) through the angle scanning means (19, 19D). Thus, the image formation characteristic can be measured with a high precision according to the numerical apertures.

In this case, according to resolution required for the projection optical system (PL), it is desirable to adjust the width of the angular scanning performed by the angle scanning means (19, 19D) with respect to the light beam ($L_1$, $L_{-1}$) from the measuring reference unit (17). Specifically, when high resolution is required, the range of the angular scanning for the light beam by means of the angle scanning means (19, 19D) is made broad. When low resolution is permitted, the range of the angular scanning for the light beam by the angle scanning means (19, 19D) is made small. Thus, the image formation characteristic can be measured with a high precision according to the required resolution level.

Furthermore, as an example of the measuring optical system (15), this optical system is constituted such that the detection light which has been subjected to the angular scanning by the angle scanning means (19, 19D) after passing through the measuring reference unit (17) is irradiated on the substrate side reference mark (14A) through the projection optical system (PL), and the measuring optical system receives a pair of or a plurality of the detection lights emitted from the substrate side reference mark. It is desirable to measure the image formation characteristic of the projection optical system (PL) based on the detection light which is received in the above-described manner. Thus, the image formation characteristic can be measured with a simple constitution.

Furthermore, using the detection lights which pass through the measuring reference unit (12) and are set to a plurality of the different angle states by the angle scanning means (19, 19D), the position of the substrate side reference mark (14A) is detected thorough the measuring optical system (15), and the image formation characteristic of the projection optical system (PL) may be measured based on the detection results. As described above, by detecting the position of the substrate side reference mark (14A) using the detection lights at the different angle states, the variation quantity of the focus position of the image formation plane is measured. In addition, the image formation characteristic and the like is also measured in the case where image formation light beam of the large numerical aperture is used.

Furthermore, in an exposure apparatus which projects an original pattern image formed on a mask (R) onto a photosensitive substrate (W) through a projection optical system (PL), the improvement comprises a substrate side reference unit (12) disposed between the projection optical system (PL) and the substrate (W), on which a substrate side reference mark (14A) is formed; a measuring reference unit (17) disposed on a predetermined reference plane which is located at a separate position from the mask (R); angle scanning means (19, 19A) for performing angular scanning for light beam from the measuring reference unit (17) within an effective aperture of the projection optical system (PL); and a measuring optical system (15) detecting, in order to measure an image formation characteristic, the substrate side reference unit (14A) through the projection optical system (PL) using the detection light which is subjected to the angular scanning by the angle scanning means (19, 19D) after passing through the measuring reference unit (17).

In the exposure apparatus of the present invention, when line widths and the like of a transfer pattern on the mask (R) change so that the substantial numerical aperture of image light beam from the projection optical system (PL) changes, the image formation characteristic can be precisely measured under the condition of such numerical aperture, by controlling the angle of incidence of the light beam from the measuring reference unit (17) relative to the substrate side reference mark (14A) with the angle scanning means (19, 19D).

In this case, as an example of the measuring optical system (15), this optical system is constituted such that the detection light having being subjected to the angular scanning by the angle scanning means (19, 19D) after passing through the measuring reference unit (12) is irradiated on the substrate side reference mark (14A) through the projection optical system (PL), and the measuring optical system receives a pair of or a plurality of the detection lights emitted from the substrate side reference mark. It should be further provided with an image formation characteristic correction means (28) which corrects the image formation characteristic of the projection optical system (PL) based on the detection results of the measuring optical system (15).

At this time, the image formation characteristic is corrected through the image formation correction means (28) in order to cancel the variation quantity of the image formation characteristic, i.e., magnification error and the like, which is measured based on the detection results of the measuring optical system (15), whereby an exposure operation is always conducted under the optimum image formation characteristic and superposition precision is maintained. Moreover, in the case where the focus position of the image formation plane of the projection optical system (PL) changes, the focus position of the substrate (W) may be controlled using, for example, a stage mechanism as the image formation characteristic correction means.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

An embodiment of the present invention will now described with reference to the accompanying drawings. In this embodiment, the present invention is applied to a projection exposure apparatus adopting a step-and scan method in which under the situation where the patterns of a reticle as a mask are partially projected onto a wafer through a projection optical system, the reticle pattern is sequentially transferred onto each shot region on the wafer by synchronously scanning the reticle and the wafer against the projection, optical system. Moreover, in this embodiment, a measuring optical system adopting a homodyne interference method is used as a part of a monitoring mechanism for an image formation characteristic.

Figure 1:
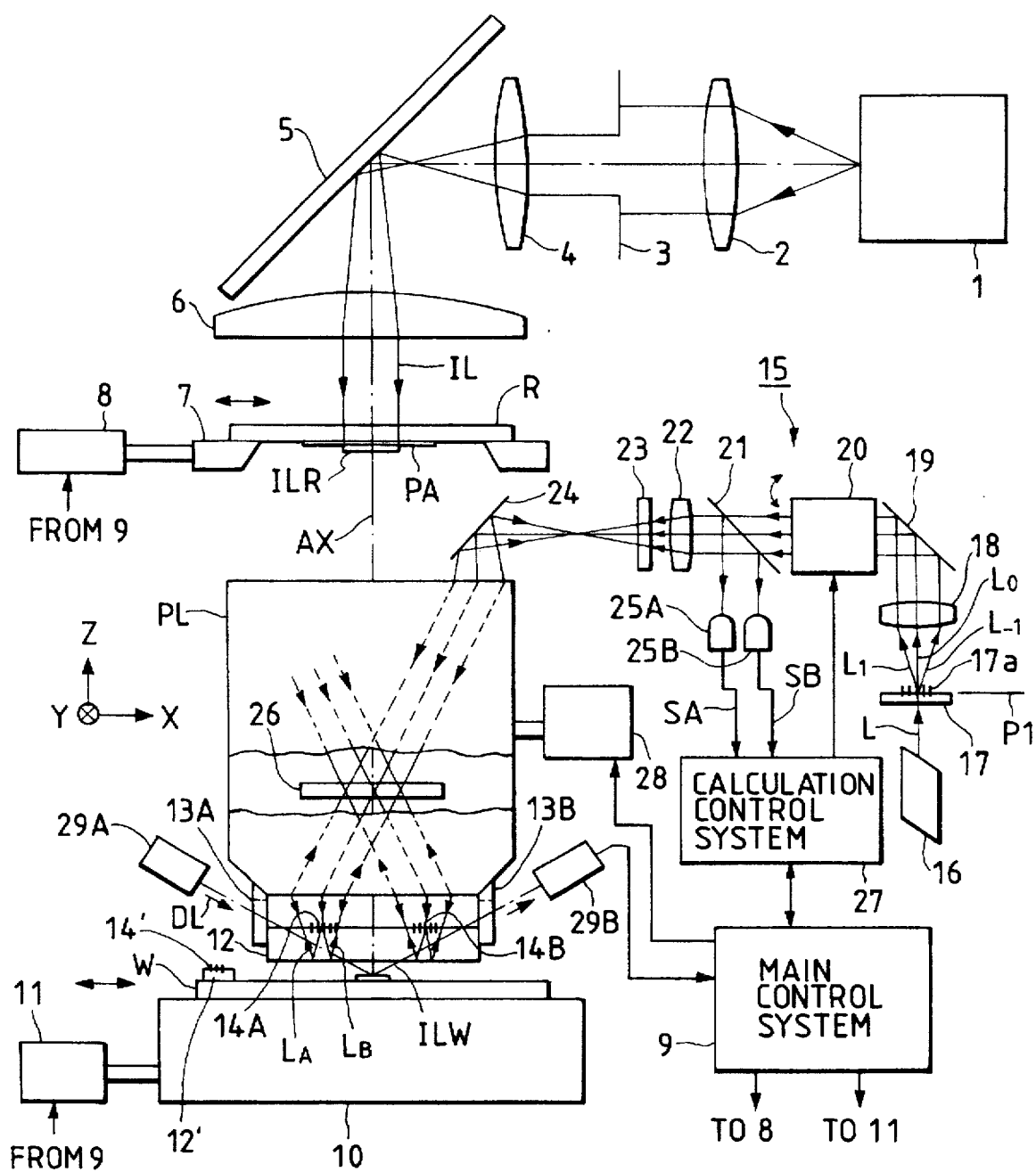
FIG. 1 is a diagrammatic view partially cutaway, showing a projection exposure apparatus of an embodiment of the present invention.

FIG. 1 shows a total structure of the projection optical system of this embodiment. Referring to FIG. 1, illumination light IL which is emitted from an illuminance distribution uniformizing optical system 1 such as an exposure light source and a fly eye lens is incident on amirror 5 via a first relay lens 2, a variable field stop (reticle blind) 3, and a second relay lens 4. Then, the illumination light IL is reflected downward by the mirror 5 and illuminates, through a condenser lens 6, a slit-shaped illumination region ILR on a pattern region PA of the reticle R with a uniform illuminance distribution. In this embodiment, excimer laser beam such as KrF exicimer laser (wave length of 248 nm) and ArF excimer laser (wave length of 193 nm is used as the illumination light IL. It should be noted that higher harmonic wave of such as metal vapor laser and YAG laser or spectral-line (i line with wave length of 365 nm) of a mercury lamp may also be employed.

At the time of the exposure, the illumination light IL passing through the illumination region ILR on the reticle R is incident into the projection optical system PL which is telecentric on both side or on one side of the wafer), and then the image produced by reducing the pattern in the illumination region ILR with projection magnification $\beta$ ($\beta$: for example, of magnification of ¼, ⅕) by means of the projection optical system PL is projected and exposed on the slit-shaped exposure region ILR on the wafer, having a surface to which a photoresist layer is applied. At this time, as described later, an autofocus control is conducted so that the surface of the wafer (W) agrees with the image formation plane of the projection optical system PL. Hereinafter, a description is made under the situation where an Z-axis is drawn in parallel with the optical axis AX of the projection optical system PL, a X-axis is drawn in parallel with the paper plane of FIG. 1 on the plane which is perpendicular to the Z-axis and an Y-axis is drawn perpendicular to the paper plane of FIG. 1.

In this embodiment, the reticle R is held on a reticle stage 7. The reticle stage 7 is constituted so that it is capable of positioning the reticle two dimensionally on the plane perpendicular to the optical axis AX of the projection optical system PL and is capable of scanning the reticle R in the X direction (scanning direction) at a predetermined speed. Two dimensional co-ordinates of the reticle stage 7 measured by a laser interferometer (not shown) on the reticle side are supplied to a main control system 8 which performs overall controlling of the operations of the whole of the apparatus. The main control system 9 controls the position of the reticle stage 7 and the scanning speed through a reticle stage driving section 8, based on the co-ordinates supplied thereto.

On the other hand, the wafer W is placed on a wafer stage 10 through a wafer holder (not shown) which has an ability to finely rotate. The wafer stage 10 can position the wafer W in the X and Y-directions and scan the wafer W in the X-direction at a constant speed. Moreover, the wafer stage 10 controls the position of the wafer W in the Z-direction (focus position) by means of an auto-focus method. The two-dimensional coordinates of the wafer stage 10 measured by the laser interferometer (not shown) on the wafer side are supplied to the main control system 9. The main control system 9 controls the operations of the wafer stage 10 through a wafer stage driving section 11. At the time of the exposure operation, through the reticle stage 7, the reticle R is scanned for the illumination region ILR in+X-direction (or−X-direction) at a speed of $V_R$, and in synchronization with the scanning of the reticle R, one shot regionon the wafer W is scannedon an exposure region ILW at a speed of $\beta \cdot V_R$ ($\beta$: projection magnification) through the wafer stage 10.

Furthermore, a lens controller 28 to correct the projection magnification of the projection optical system PL is connected to the projection optical system PL of this embodiment. The lens controller 28 controls, for example, the pressure in the gas chamber between the predetermined two lenses provided in the projection optical system PL according to instructions from the main control system 9, whereby the controller 28 corrects the projection magnification. It should be noted that instead of the lens controller 28, a mechanism which corrects the projection magnification by driving the lens on the reticle side provided in the projection optical system PL may be employed.

Furthermore, on the side surface portion of the projection optical system PL, focus position detection systems 29A and 29B adopting an oblique incidence method are provided, which are composed of an irradiation optical system 29A which irradiates the detection light DL obliquely with respect to the optical axis AX, the detection light DL being for forming the slit image or the spot image on the exposure region ILW of the surface of the wafer W; and a light receiving optical system 29B which receives the reflected light fromthe image to form again the slit image, for example, on the oscillation slit (vibration slit) and receives the detection light passing through the oscillation slit. In this embodiment, as described later, since a light transmissible reference unit 12 is provided between the projection optical system PL and the wafer W, the detection light DL from the irradiation optical system 29A, which is at a wavelength range exhibiting a weak photosensitivity against the photoresist layer, transmits through the reference unit 12 and is irradiated onto the wafer W. The detection light DL reflected from the wafer W transmits through the reference unit 12 and then is incident onto the light receiving optical system 29B. A focus signal, which changes within a predetermined range approximately in proportion to the quantity of the defocus from the image formation plane on the surface of the wafer W, is output from the light receiving optical system 29B. The focus signal is supplied to the main control system 9.

At an initial stage, for example, an adjustment is made so as to make the focus signal zero in the state where the surface of the wafer W is focused on the image formation plane. The main control system 9 controls the driving section disposed in the Z-direction within the wafer stage 10 through the wafer stage driving section 11 so that the focus signal is kept at zero. Thus, when adopting the auto-focus method, the surface of the wafer W is always focused onto the image formation plane. Furthermore, in the light receiving optical system 29B, provided is a mechanism for adding a desired offset to the focus signal according to the instruction from the main control system 9. As described later, when the focus position of the image formation plane in the projection optical system PL changes, the main control system 9 is designed such that the system 9 is able to give the offset to the focus signal according to the change of the focus signal.

In the projection exposure apparatus of this embodiment, provided is a monitor mechanism of the image formation characteristic for detecting the variation quantity of the focus position of the image formation plane of the projection optical system and the variation quantity of the projection magnification thereof. First, referring to FIG. 1, the reference unit 12 on the wafer side in the monitor mechanism is disposed between the projection optical system PL and the wafer W. The reference unit 12 formed of a light transmissible glass substrate is fixed to the projection optical system PL through a supporting members 13A and 13B. On the upper surface 12a (see FIG. 2A), reference marks 14A and 14B are formed in symmetry with the X-direction centering the optical axis AX of the projection optical system PL.

Figure 2A:
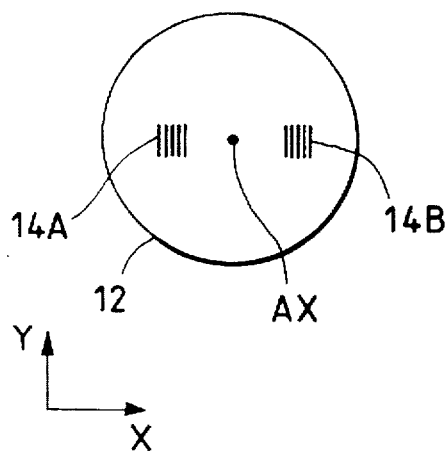
FIG. 2A is a plan view showing a reference unit 12 in FIG. 1.

FIG. 2A is a plan view of the reference unit 12. As shown in FIG. 2A, the reference marks 14A and 14B are ones formed of a phase type diffraction grating, each being formed at a predetermined pitch in the X-direction. The reference marks 14A and 14B can be formed by etching a metallic film such as chromium deposited on a glass plane or by etching the glass plane itself. In this case, an exposure region on the wafer W of this embodiment is the slit-shaped exposure region ILW having a narrow width in the X-direction (scanning direction). The interval in the X-direction between the reference marks 14A and 14B is set such that image light beam by the illumination light hardly passes through the reference marks 14A and 14B. Therefore, the reference unit 12 has little effect on a projected image of the pattern of the reticle R. There are cases where the image formation flux due to the illumination light IL is incident to some degree on the reference marks 14A and 14B. In this case, the reference marks 14A and 14B are actually small compared to the exposure region ILW so as to be neglected, and their influence on the projected image can be neglected.

Figure 2B:
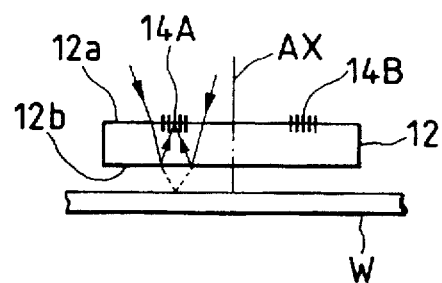
FIG. 2B is a side view showing the reference unit 12.

Moreover, in this embodiment, as described later, the wavelength of the detection light (laser beam L) for monitoring the image formation character is 633 nm, and it is different from the wavelength $\lambda_0$ of the illumination light IL for exposure. In such case, the optical pass length of the step difference of unevenness in the reference marks 14A and 14B is set such that it is nearly equal to n·$\lambda_0$/4 (n: integer) relative to the wavelength $\lambda_0$ of the illumination light IL, whereby the influence on the projected image can be more controlled. In the case where the wavelength $\lambda_0$ of the illumination light IL is different from the wavelength $\lambda_1$ of the detection light, it is desirable to deposit a dichroic film, which transmits the illumination light and reflects the detection light, on the lower surface of the reference unit 12 on the side of the wafer W, as shown in FIG. 2B. Thus, usage efficiencies of the illumination light IL and the detection light increase. On the other hand, when the wavelengths of the illumination light IL and the detection light are approximately equal, the upper surface of the reference unit 12 may be a half-mirror plane. However, when the exposure region ILW is slit-shaped as in this embodiment and the illumination light IL hardly passes through near an illumination section of the detection light, only the illumination section of the detection light may be prepared for the mirror plane. Moreover, in the state where the surface of the wafer W is focused on the projection optical system PL while irradiating the illumination light, as shown in FIG. 2B the upper surface of the reference unit 12 where the reference mark 14A is formed is disposed in order that it is conjugated with the surface of the wafer W under the detection light.

Next, returning to FIG. 1, the measuring optical system 15 adopting the homodyne interference method, which is incorporated in the monitor mechanism for monitoring the image formation characteristic of this embodiment, is arranged on the side surface of the projection optical system PL. In the measuring optical system 15, laser beam L of the wavelength $\lambda_1$ serving as the detection light is emitted from a laser light source 16. A He-Ne laser light source (wavelength $\lambda_1$ of 633 nm) is used as the laser light source 16. A He-Cd laser light source and a continuous oscillation laser light source such as a semiconductor laser device may alternatively be employed. Moreover, in this embodiment, the excimer laser beam (wavelength of 248 nm and 193 nm) is used as the illumination light IL. When the continuous oscillation laser light source is used, chromatic aberration of the detection light (laser beam L) becomes larger in the projection optical system PL. In order to prevent the chromatic aberration, high oscillation ultraviolet light (wavelength of 244 nm, 257 nm etc.) such as an argon laser (oscillation wavelength of 488 nm, 514 nm) may be used as the detection light. Furthermore, the exicimer laser beam itself in spite that it operates pulse oscillation may be used.

Since in this embodiment, the difference between the wavelength $\lambda_0$ of the illumination light IL and the wavelength $\lambda_1$ of the detection light (laser beam L are comparatively large, a chromatic aberration control plate 26 is arranged in the projection optical system PL, which corrects the chromatic aberration about the detection light by polarizing an optical path of the detection light. The chromatic aberration correction control plate 26 is formed of a glass substrate. A phase type diffraction grating for polarizing the optical path of the detection light is formed in a passing region of the detection light which is one surface of the glass substrate. The step difference of the diffraction light is set so that it has no effect on the illumination light IL.

The linearly polarized laser beam L emitted from the laser light source 16 is incident onto a reference plate 17 serving as a measuring reference unit, which is in fixed positional relation with the projection optical system P1. A diffraction grating 17a with a predetermined pitch is formed on the surface of the reference plate 17, which is used as a reference plane P1. Upon incidence of the laser beam L, 0 order light $L_0$, +1 order diffracted light $L_1$, and −1 order diffracted light $L_{-1}$ are emitted from the diffraction grating 17a. These three diffracted lights $L_0$, $L_1$ and $L_{-1}$ are used as the monitoring detection light of the image formation characteristic. Specifically, these three diffracted lights $L_0$, $L_1$ and $L_{-1}$ travel through a first relay lens 18 and become beam which proceed in parallel. The diffracted lights $L_0$, $L_1$ and $L_{-1}$ in the form of the light beam travel through a mirror 19 and are incident into a modulator 20, which is disposed near the surface serving as a Fourier transform surface against the reference plane P1. The modulator 20 is constituted of a polariscope, an oscillation mirror (vibration mirror) or the like formed of an acousto-optic modulator, which has a function to emit beam after oscillating its progression direction at a predetermined angle range. The light beam having the oscillated progressive direction in pupil space will be shifted laterally in an object space.

After the diffracted lights $L_0$, $L_1$ and $L_{-1}$ with a modulation of position oscillated in a pitch direction through the modulator 20, pass through a polarization beam splitter 21, the lights $L_0$, $L_1$ and $L_{-1}$ are converged by a second relay lens 22 and form an image of the diffracted grating 17a. The of the diffraction grating 17a is subjected to modulation of the position oscillating in the pitch direction by the operation of the modulator 20. Moreover, a ¼ wave plate 23 is disposed immediately after the second relay lens 22, and the diffracted lights $L_0$, $L_1$ and $L_{-1}$ are converted to circularly polarized lights by the ¼ wave plate 23. The diffracted lights $L_0$, $L_1$ and $L_{-1}$ diverging from the image of the diffraction grating 17a are incident onto the projection optical system PL through an optical path bending mirror 24. Then, the diffracted lights $L_0$, $L_1$ and $L_{-1}$ are incident onto the reference unit 12 on the side of the side of the wafer W after passing through the projection optical system PL. At this time, as described before, the chromatic aberration of the projection optical system PL against these diffracted lights are corrected by the chromatic aberration control plate 26.

Figure 3A:
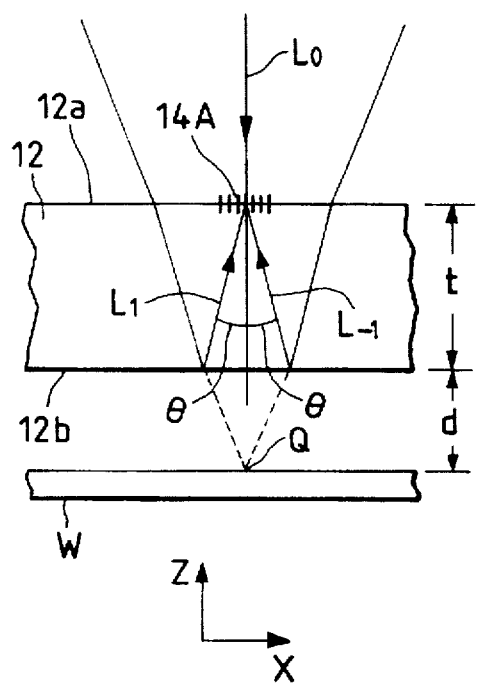
FIGS. 3A to 3C are side views for explaining situations of detection light incident onto a reference mark 14A of the reference unit 12 of FIG. 1 and of diffracted light from the reference mark 14A.

FIG. 3A shows an enlarged view of the reference mark 14A on the reference unit 12 on the side of the wafer W. Referring to FIG. 3A, among the diffracted lights $L_0$, $L_1$ and $L_{-1}$ which are incident onto the reference unit 12, the 0 order diffracted light Lo is incident onto the reference mark 14A on the upper surface 12a of the reference unit 12. The +1 order diffracted light $L_1$ and the −1 order diffracted light $L_{-1}$ pass through the region on the upper surface of the reference unit 12, which outside the reference mark 14A. Thereafter, the diffracted lights $L_1$ and $L_{-1}$ are reflected in the lower surface 12b of the reference unit 12 and are incident onto the reference mark 14A. Therefore, the image of the diffraction grating 17a arranged on the reference plate 17 shown in FIG. 1 is formed on the reference mark 14A.

In this case, when the pitch of the diffraction grating 17a of FIG. 1 will be now expressed as $P_R$, the pitch of the reference mark 14A on the reference unit 12 on the wafer side will be now expressed as P, and a comprehensive projection magnification (the projection magnification from the diffraction grating 17a to the reference mark 14A) of the image formation optical system which is composed of the first and second relay lenses 18 and 22 and projection optical system PL will now be expressed as M, the later pitch P is set to M times the former pitch $P_R$.

$$P = M \cdot P_R$$

Figure 3B:
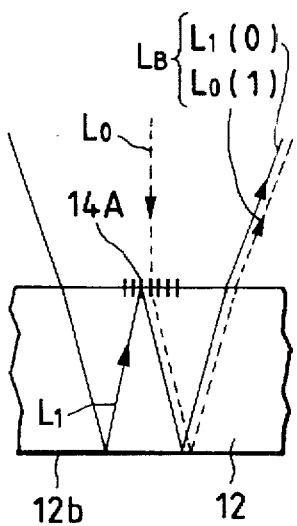
Figure 3C:
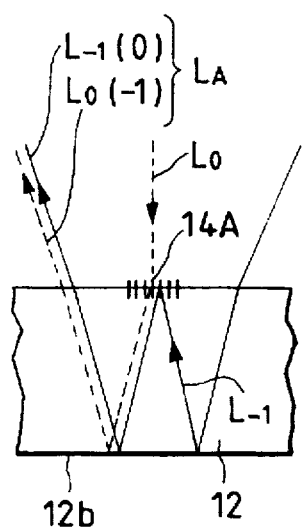

As a result, as shown in FIG. 3B, the 0 order light (specular reflected light or regular reflected light) $L_1(0)$ of the +1 order diffracted light at the reference mark 14A and +1 order diffracted light $L_0(1)$ of the 0 order diffracted light $L_0$ at the reference mark 14A travel in parallel in the reference unit 12 and they are reflected at the lower surface 12b of the reference unit 12. Thereafter, they return to the projection optical system PL from the upper surface 12a of the reference unit 12, in parallel with the incident direction of the −1 order diffracted light $L_{-1}$. Furthermore, as shown in FIG. 3C, the 0 order light specular reflected light) $L_{-1}(0)$ of the −1 order diffracted light $L_{-1}$ at the reference mark 14A and the −1 order diffracted light $L_0(-1)$ of the 0 order light $L_0$ at the reference mark 14A travel in parallel in the reference unit 12, and they are reflected at the lower surface 12b of the reference unit 12. Thereafter, they return to the projection optical system PL from the upper surface 12a of the reference unit 12, in parallel with the incident direction of the + order diffracted light $L_1$. Hereinafter, an interference light composed of the 0 order light $L_1(0)$ and the +1 order diffracted light $L_0(1)$ shall be called an interference light $L_B$ and an interference light composed of the 0 order light $L_{-1}(0)$ and the −1 order diffracted light $L_0(-1)$ shall be called an interference light $L_A$.

Returning to FIG. 1, the interference light $L_A$ and $L_B$ travel the optical paths of the diffracted lights $L_{-1}$ and $L_1$, approximately in reverse, each being incident, and they reach the ¼ wave plate 23 through the projection optical system PL and the mirror 24. The interference lights $L_A$ and $L_B$ pass through the second relay lens 22, which have been converted to linearly polarization by rotation of 90 degree relative to the angle at the time of incidence through the ¼ wave plate 23. Then, they are reflected at the polarization beam splitter 21 and incident into a photoelectric sensors 25A and 25B formed of such as aphotodiode, respectively. The measuring optical system 15 is constituted by the foregoing laser light source 16, the mirror 24, and the photoelectric sensors 25A and 25B. Detection signals SA and SB, which are given by photoelectric conversion of the interference lights $L_A$ and $L_B$, are supplied to a computation control system 27.

Furthermore, in FIG. 1, a second measuring optical system (not shown), which irradiates three diffracted lights as a detection light onto the other reference mark 14B of the reference unit 12, is disposed in symmetry with the measuring optical system 15. Two detection signals from the second measuring optical system are also supplied to the computation control system 27. At this time, as the detection light used in the second measuring optical system, light beam provided by branching the laser beam L supplied from the laser light source 16 in the measuring optical system 15 should be employed. The computation control system 27 controls the operation of the modulator 20, and, at the same time, it obtains the shifting quantity of the focus position of the image formation plane of the projection optical system PL and the lateral shifting quantity of the projected image, from the detection signals SA and SB. Moreover, the computation control system 27 obtains the shifting quantity of the image formation plane of the projection optical system PL and the lateral shifting quantity of the projected image, from the two detection signal supplied from the second measuring optical system (not shown). For example, the average of the shifting quantity of the foregoing two focus positions shall be a final shifting quantity of the image formation plane and the variation quantity of the projection magnification shall be given from the lateral shifting quantity of the foregoing two projected images. It should be noted that the variation quantity of the projected magnification can be given only from the lateral shifting quantity of the projected image which is obtained from the detection signals SA and SB supplied from the other measuring optical system 15.

The data concerning the final shifting quantity of the focus position of the image formation plane and the final variation quantity of the projected image is supplied to the main control system 9. The main control system 9 adds an offset, which accords to the shifting quantity of the focus position, to focus signals, which are generated in the light receiving optical system 29B of the focus position detection system 29A and 29B. As a result, the main control system 9 makes the wafer stage driving section 11 operate so that the surface of the wafer W is focused on the image formation plane after varying its focus position and makes the lens controller 28 correct the projected magnification of the projected optical system PL. Thus, even though the focus position and the projected magnification of the projection optical system PL change due to a change of atmospheric pressure and irradiation of the illumination IL, the pattern image of the reticle R can be exposed on each shot region of the wafer W, in the state where the surface of the wafer W is always focused on the image formation plane and the projected magnification is maintained at a predetermined value.

Next, a detection method performed in the computation control system 27 will be described with reference to FIGS. 3A to 5, in which the shifting quantity of the focus position and the lateral shifting quantity of the projected image from the two detection signals SA and SB are detected.

First, as shown in FIGS. 3B and 3C, in this embodiment, among the diffracted lights $L_0$, $L_1$, and $L_{-1}$ incident onto the reference unit 12, the ±1 order diffracted lights $L_0(1)$ and $L_0(-1)$ of the 0 order light $L_0$ proceed in parallel toward the incident direction of the $-1$ order diffracted light $L_{-1}$ and the $+1$ order diffracted light $L_1$, respectively. Therefore, in FIG. 3A, using the pitch of the reference mark 14A and the wave length $\lambda_1$ of the ±1 order diffracted lights $L_0$, $L_1$ and $L_{-1}$, the angle θ between the 0 order light and the ±1 order diffracted lights $L_0(1)$ and $L_0(-1)$ can be expressed as follows.

$$\sin\theta = \lambda_1/P \quad (1)$$

In this case, the 0 order light $L_{-1}(0)$ of the $-1$ order diffracted light $L_{-1}$ and the $-1$ order diffracted light $L_0(-1)$ become the interference lights $L_A$ which proceed in parallel. The 0 order light $L_1(0)$ of the $+1$ order diffracted light $L_1$ and the $+1$ order diffracted light $L_0(1)$ become the interference light $L_B$ which proceed in parallel. Photoelectric conversion signals of the interference lights $L_A$ and $L_B$ become the detection signals SA and SB, respectively.

Figure 4:
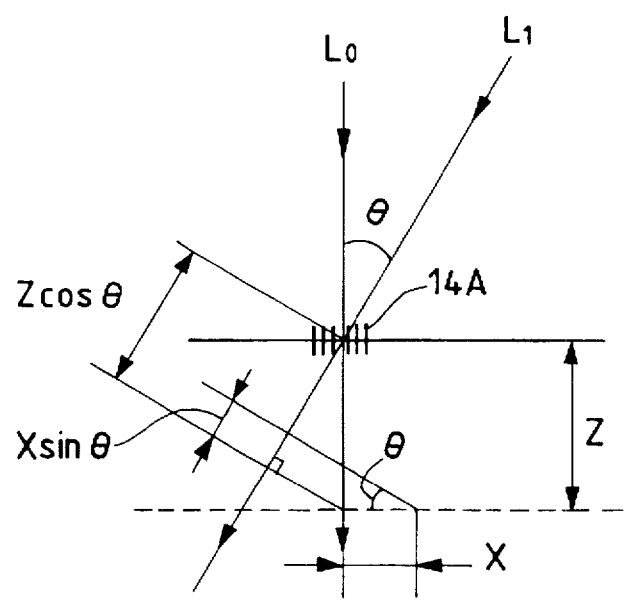
FIG. 4 is a schematic view for explaining a relation between a position shifting of the reference mark 14A from a diffracted light $L_0$, $L_1$ and phase difference, which is created between +1 order diffracted light of 0 order light $L_0$ and 0 order diffracted light of +1 order diffracted light L1.

Here, consideration concerning intensity change of the these two interference lights $L_A$ and $L_B$ will be made. The intensities of these interference lights $L_A$ and $L_B$ are considered to change because of the variation quantity of the relative position (the lateral shifting quantity of the projected image) of the image of the reference mark 14A to that of the diffraction grating 17a and because of the defocus quantity (the shifting quantity of the defocus position). When the variation quantity of the relative position and the defocus quantity are now expressed as x and z, respectively, as shown in FIG. 4 which shows an optical path equivalent to that of FIG. 3A, the optical path difference between the 0 order light $L_0$ and the $+1$ order diffracted light L1 will be equal to $(z(1-\cos\theta)+x\cdot\sin\theta)$. When the phase difference between obtained two light beames is referred as $\phi_B$, the phase difference $\phi_B$ is expressed using the formula (1), as follows.

$$\phi_B = 2\pi((x/P)+(\lambda_1 z/(2P^2))) \quad (2)$$

where the formula (2) is obtained utilizing the equation $1-\cos\theta \simeq \sin^2\theta/2$.

Using the phase difference $\phi_B$, the intensity $I_B$ of the interference light $L_B$ obtained by synthesizing the 0 order light $L_1(0)$ and the $+1$ order diffracted light $L_0(1)$ can be expressed as follows.

$$I_B \propto 1+\cos\phi_B \quad (3)$$

Similarly, since the optical path difference between the 0 order light $L_0$ and the $-1$ order diffracted light $L_{-1}$ in FIG. 3A is equal to $(z(1-\cos\theta)-x\cdot\sin\theta)$, the phase difference $\phi_A$ between the 0 order light L-1(0) and the $-1$ order diffracted light $L_0(-1)$ of FIG. 3C corresponding to the formula (2) and the intensity $I_A$ of the interference $L_A$ obtained by synthesizing the 0 order light $L_{-1}(0)$ and the $-1$ order diffracted light $L_0(-1)$ are expressed, respectively, as follows.

$$\phi_A = 2\pi((x/P)-(\lambda_1 z/(2P^2))) \quad (4)$$

$$I_A \propto 1+\cos\phi_A \quad (5)$$

Figure 5:
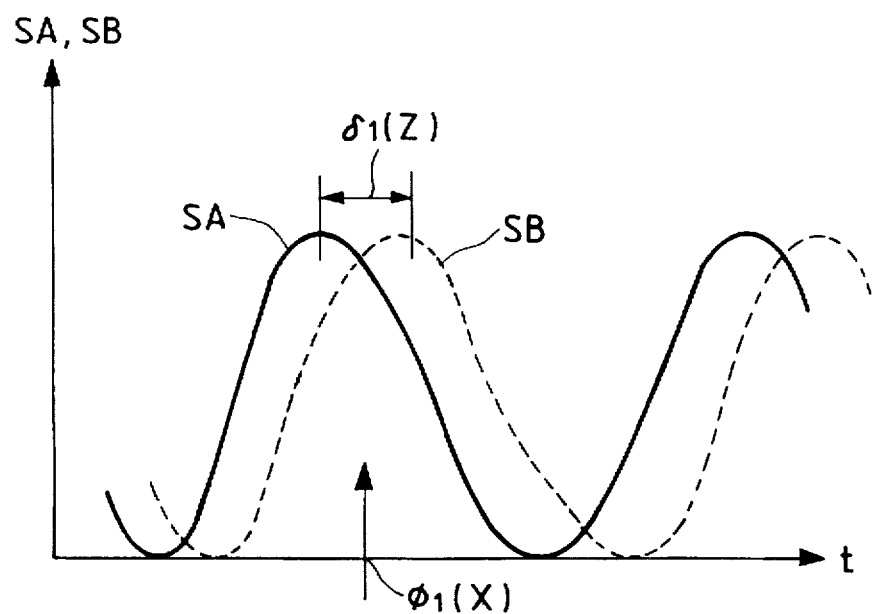
FIG. 5 shows wave forms showing detection signals SA and SB provided from photoelectric sensors 25A and 25B of FIG. 1.

The intensity $I_A$ of the formula (5) and the intensity $I_B$ correspond to the intensities of the detection signals SA and SB, respectively, which are supplied to the computation control system 27 of FIG. 1. Since the detection of the phase is impossible with such homodyne interference method, the image of the diffraction grating 17a is made laterally shift, at a constant rate, in the X-direction on the reference mark 14A by driving the modulator 20 of FIG. 1. Thus, the variation quantity x of the relative position of the formulas (2) and (4) changes at a constant rate, so that the detection signals SA and SB change in a form of sine wave, as shown in FIG. 5. The variation quantity x and the defocus quantity z of the relative position can be obtained as the following formulas, by addition and subtraction about the formulas (2) and (4).

$$x = (P/(2\pi))\cdot((\phi_B+\phi_A)/2) \quad (6)$$

$$z = (P^2/(\pi\lambda_1))\cdot((\phi_B-\phi_A)/2) \quad (7)$$

As is apparent from the formulas (6) and (7), the defocus quantity z can be obtained using the formula (7) from the phase difference between the detection signals SA and SB. In addition, as is clear from the formula (6), since the average of the phases of the detection signals SA and SB corresponds to the variation quantity of the relative position, it is possible to detect the variation quantity x of the relative position when the projection magnification changes because of the change of the projection optical system PL.

Specifically, in the computation control system 27, as shown in FIG. 5, the phase difference $\delta_1(z)$ between the two detection signals SA and SB is obtained, and at the same time, the average $\phi_1(x)$ of the phases of the two detection signals SA and SB is obtained.

Furthermore, the phase difference $\delta_{10}(z)$ between the two detection signals SA and SB and the average $\phi_{10}(x)$ of the phases of the two detection signals SA and SA have been previously obtained in the state where the defocus quantity z is equal to zero and no variation of the projection magnification is present (x=0). In the computation control system 27, the defocus quantity $z_1$ is computed by substituting the variation quantity $(\delta_1(z)-\delta_{10}(z))$ of the phase difference of the two detection signals SA and SB with the right side of the formula (7), and the variation quantity $z_1$ of the relative position is computed by substituting the variation quantity $(\phi_1(x)-\phi_{10}(x))$ of the average of the phases of the two detection signals SA and SB with the right side of the formula (6) Moreover, the variation quantity of the projection magnification is also computed from the image height of the reference mark 14A and the variation quantity $x_1$ of the relative position thereof.

Furthermore, in this embodiment, the other reference mark 14B on the reference unit 12 is detected with the second measuring optical system (not shown), whereby the defocus quantity $Z_2$ and the variation quantity $x_2$ of the relative position are computed. In order to obtain high precision detection results, in the computation control system 27, the average $(z_1+z_2)/2$ of two focus quantities is obtained as the defocus quantity $\Delta z$. The variation quantity $\Delta \beta$ of the projection magnification is obtained from the difference between the variation quantities $(x_1-x_2)$ of the two relative positions and the distance between the reference marks 14A and 14B. The data concerning the defocus quantity $\Delta z$ and the variation quantity $\Delta \beta$ of the projection magnification are supplied to the main control system 9. As described above, by obtaining the variation quantity of the relative distance between the two reference marks 14A and 14B, the variation quantity $\Delta \beta$ of the projection magnification can be detected more precisely. At this time, as shown in FIG. 2A, it is necessary that the pitch direction (measuring direction) of the two reference marks 14A and 14B on the reference unit 12 includes the component of the meridional direction (radius vector) relative to the optical AX of the projection optical system PL.

A description is made about an example of actual numerical values in this embodiment. First, it is assumed that the wavelength $\lambda_1$ of the diffracted light $L_0$, $L_1$, and $L_{-1}$ as the detection light is 633 nm, the pitch P of the reference marks 14A and 14B is 1 μm, and the distance between the reference marks 14A and 14B is 20 nm. Then, assuming that the projection magnification of the projection optical system PL shifts by 1 ppm and the focus position shifts by 0.2 μm, since the distance of between the reference marks 14A and 14B shifts by 0.02 μm, the difference of the average phase of the reference marks 14A and 14B corresponding to the positional change the change of the projection magnification) will be 14.4° inferred from the formula (6). In addition, the phase difference ($\phi B-\phi A$) corresponding to the variation of the focus position becomes 45° inferred from the formula (7). Such phase difference has a value within a range which can be detected with a sufficient precision. It is found that the variation quantities of the focus position and the projection magnification can be detected with a high precision by this embodiment. Thereafter, as previously mentioned above, the correction for the projection magnification of the projection optical system PL is conducted based on the detected value by the lens controller 28, and the correction for the focus position is conducted based on the detected value by the wafer stage driving system 11.

Next, a constitution of the reference unit 12 on the wafer side of FIG. 1 will be described. In this embodiment, since the wavelength $\lambda_1$(633 nm) of the detection light and the wavelength $\lambda_0$ of the exposure illumination light IL are different, a dichroic film which reflects the diffracted lights $L_0$, $L_1$ and $L_{-1}$ of a long wavelength as the detection light and transmits the illumination light IL is deposited on the lower surface 12b of the reference unit 12, as shown in FIG. 3A.

In the state where the surface of the wafer W is focused on the image formation plane, a point Q on the wafer W and the reference mark 14A on the upper surface of the reference unit 12 are set so that they are conjugated each other, under the diffracted lights $L_0$, $L_1$ and $L_{-1}$. That is, when the thickness of the reference unit 12 is referred as t; the distance between the lower surface 12b of the reference unit 12 and the wafer W, d; and the refractive index of the reference unit 12, n, the following relation holds.

$$d=t/n \quad (8)$$

Noted that the constitution of the reference unit 12 can be simplified by forming a reference mark 14A on the lower surface 12b of the reference unit 12, in spite that the reference mark 14A makes no conjugate with the surface of the wafer W. Moreover, in FIG. 1, it is possible to form the reference mark 14A partially on one surface of a predetermined lens in the projection optical system PL. Although the reference unit 12 is formed of the single glass substrate in the above described embodiment, it may be formed of two parallel plane plates.

On the other hand, the measuring reference mark is constituted by the diffraction grating 17a. In order to detect the position precisely, a stability of the position of the diffraction grating 17a in a direction perpendicular to its optical axis is also required. When the variation of the projection magnification is measured from the variation of the distance between the reference marks 14A and 14B, a stability of the positions of the mirror 24 for optical path bending and the like is important, and only a stability in the optical axis direction for a focus position detection is required in order to achieve the stability of the diffraction grating 17a.

In the above described embodiment, the case was considered where the image of the diffraction grating 17a and the pitch of the reference mark 14A are equal, but, otherwise, the case does well where the pitch of the reference mark 14A is, for example, twice that of the image of the diffraction grating 17a. In this case, for example, in FIG. 3A, interference light of the ±1 order diffracted light of the 0 order light $L_0$ with the +1 order diffracted light of the +1 order diffracted light $L_1$, and interference light of the ±1 order diffracted light of the 0 order light $L_0$ with the −1 order diffracted light of the −1 order diffracted light $L_{-1}$ will be detected, respectively.

Next, another embodiment of the present invention will be described with reference to FIGS. 6 to 8. This embodiment of the present invention is also applied to an projection exposure apparatus adopting the step-and-scan method. However, in this embodiment, a measuring optical system adopting a heterodyne interference method is used partially in the monitoring mechanism for monitoring the image formation characteristic. The same reference symbols and numerals are given to the corresponding portions in FIGS. 6 to 8 to those in FIGS. 1 to 3C, and detailed descriptions about them are omitted. Description about a constitution of the measuring optical system will be made below.

Figure 6:
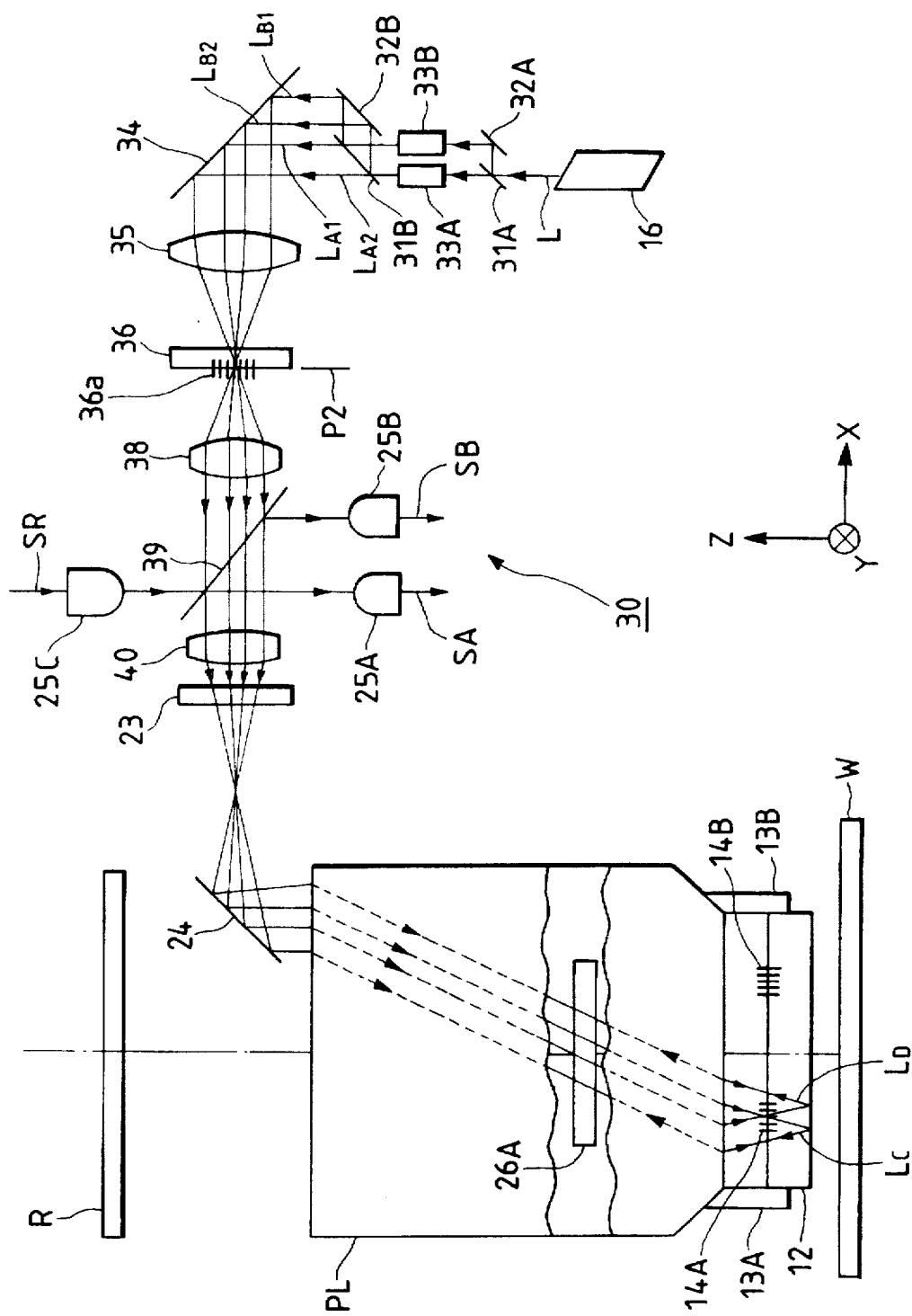
FIG. 6 is a diagrammatic view partially cutaway, showing a projection exposure apparatus of another embodiment of the present invention.

FIG. 6 shows a principal part of a measuring optical system of this embodiment. Referring to FIG. 6, on the side surface of the projection optical system PL, provided is the measuring optical system 30 adopting the heterodyne interference method which is included in the monitoring mechanism of this embodiment for monitoring the image formation characteristic. In this measuring optical system 30, laser beam L that is linearly polarization light of wavelength $\lambda_1$ is emitted as a detection light from a laser light source 16. This laser beam L is divided into two parts by a half mirror 31A. One is incident directly on a first acousto-optic modulator 33A (hereinafter called an AOM), and the other is incident on a second AOM 33B via a mirror 32A. The AOMs 33A and 33B are driven with frequencies $f_2$ and $f_1$, respectively, which have functions to perform frequency modulation for the frequencies $f_2$ and $f_1$ to output them. The difference between the frequencies $f_2$ and $f_1$ is, for example, about 50 kHz.

The laser beam output from the first AOM 33A is divided into laser beams $L_{A2}$ and $L_{B2}$ by a half mirror 31B, and the laser beam output from the second AOM 33B is divided into laser beams $L_{A1}$, and $L_{B1}$ by the half mirror 31B. The laser beams $L_{A1}$, and $L_{A2}$ are reflected by a mirror 34, and, thereafter, they are collected on a measuring reference plate 36 by a collective lens 35. On the other hand, after the laser beams $L_{B1}$, and $L_{B2}$ are reflected by the mirrors 32B and 34, respectively, and then they are collected on the reference plate 36 as the measuring reference unit by the collective lens 35. The reference plate 36 is in positional relationship relative to the projection optical system PL. A window section 36b and a diffraction grating 36a (see FIG. 7A) as the measuring reference mark are formed on the surface of the reference plate 36, which is called the reference plane P2. Moreover, the laser beams $L_{A1}$ and $L_{B1}$ are subjected to frequency modulation at the frequency $f_1$, and the laser beams $L_{A2}$ and $L_{B2}$ are subjected to frequency modulation at the frequency $f_1$ ($f_1 > f_2$). The laser beams $L_{A1}$ and $L_{B2}$ make small angles with the optical axis, respectively, the angles being symmetrical about the optical axis. The laser beam $LA_2$ and $LB_1$ make large angles with the optical axis, respectively, the angles being symmetrical about the optical axis.

Figure 7A:
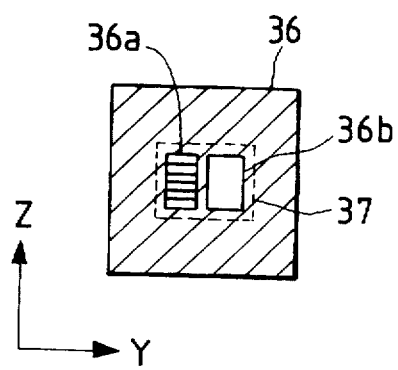
FIG. 7A is a sectional view showing a pattern arrangement of a reference plate 36 in FIG. 6.
Figure 7B:
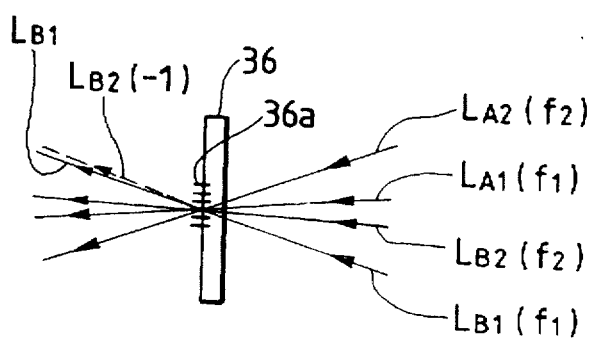
FIG. 7B is a side view showing the reference plate 36.

FIG. 7A shows a pattern arrangement of the reference plate 27. Referring to FIG. 7A, the four laser beams $L_{A1}$, $L_{B1}$, $L_{A2}$ and $L_{B2}$ are being irradiated on an irradiated region 37 which surround the diffraction 36a and the window section 36b. As shown in FIG. 7B, the pitch of the diffraction grating 36a is set so that the 0 order light of the laser beam $L_{B1}$ and the -1 order diffraction light $L_{B2}$ (-1) of the laser beam $L_{B2}$ are emitted in parallel.

Description is made returning to FIG. 6, the laser beams and the diffracted lights passing through the reference plate 36 travel through the first relay lens 38 and become light beam wherein each beam proceeds in parallel. Thereafter, the light beam is incident on the partial polarization beam splitter 39. This partial polarization beam soplitter 39 uses, as the polarization beam splitter, the irradiated region irradiated by the laser beams $L_{A1}$, $L_{B1}$, $L_{A2}$ and $L_{B2}$ which pass through the window section 36b of the reference plate 36 of the FIG. 7A. The partial polarization beam splitter 39 uses, as the mirror surface, portions of the reference plate 36 other than the window section 36b. Therefore, the 0 order light of the laser beam $L_{B1}$ and the -1 order diffracted light $L_{B2}$(-1) of the laser beam $L_{B2}$ which pass through the diffraction grating 36a of FIG. 7B are reflected as heterodyne beams of a frequency ($f_1-f_2$) by the partial polarization beam splitter 39. Then, the heterodyne beams are incident onto a photoelectric sensor 25C. The heterodyne beams are subjected to a photoelectric conversion by the photoelectric sensor 25C so that a reference beat signal SR is produced. The reference beat signal SR is output from the photoelectric sensor SR. The phase of the reference beat signal SR forms a standard.

On the other hand, the laser beams $L_{A1}$, $L_{B1}$, $L_{A2}$ and $L_{B2}$ which passed through the window section 36b of the reference plate 36 transmit through the partial polarization beam splitter 39. Thereafter, they are collected after passing through the second relay lens 40 and the ¼ wave plate 23. Then, they are incident on the projection optical system PL from the optical path bending mirror 24 to pass through it. They are incident on the reference unit 12 on the side of the wafer W. At this time, chromatic aberration of the projection optical system PL relative to the laser beams is corrected by the chromatic aberration plate 26A.

Figure 8:
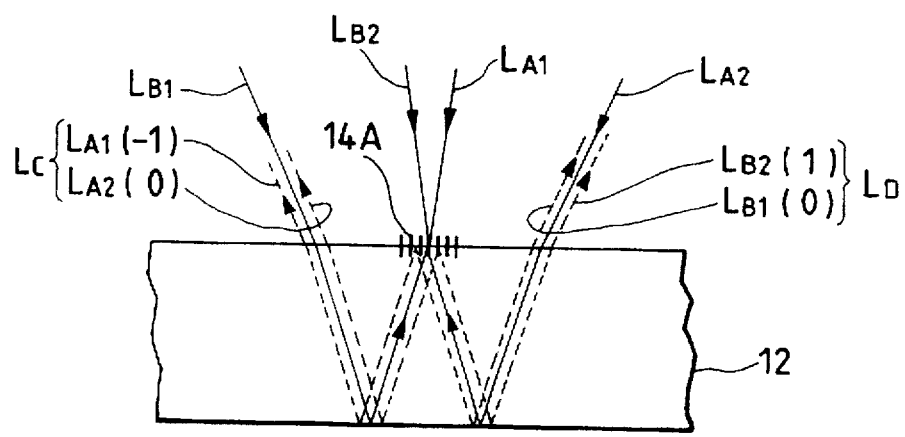
FIG. 8 is a side view for explaining situations of detection light incident onto the reference mark 14A of the reference unit 12 in FIG. 6 and of diffracted light from the reference mark 14A.

FIG. 8 shows an enlarged view at the periphery of the reference mark 14A on the reference unit 12 on the side of the wafer W. Referring to FIG. 8, among the laser beams $L_{A1}$, $L_{B1}$, $L_{A2}$ and $L_{B2}$ which are incident on the reference unit 12, the central laser beams $L_{A1}$, and $L_{B2}$ are incident on the reference mark 14A on the upper surface of the reference unit 12, and the laser beams $L_{A2}$ and $L_{B1}$ on both side of the laser beams $L_{A1}$, and $L_{B2}$ transmit through the upper surface of the region outside the reference mark 14A. Thereafter, the laser beams $L_{A2}$ and $L_{B1}$ are reflected at the lower surface of the reference unit 12 and then are incident on the reference mark 14A. Subsequently, interference fringes are formed on the reference mark 14A, which flow at the same pitch as that of the reference mark 14A and in the pitch direction. It should be noted that the pitch of the formed interference fringes may be half that of the reference mark 14A.

As a result, the 0 order light (specular reflection light) $L_{B1}(0)$ of the laser beam $L_{B1}$ and the +1 order diffracted light $L_{B2}(1)$ of the laser beam $L_{B2}$ at the reference mark 14A travel in parallel within the reference unit 12 as the heterodyne beam $L_D$ and are reflected at the bottom surface of the reference unit 12. They travel from the upper surface of the reference unit 12 in parallel with the incidence direction of the laser beam $L_{A2}$ and returnto the projection optical system PL. Moreover, the 0 order light (specular reflection light) $L_{A2}(0)$ of the laser beam $L_{A2}$ and the -1 order light $L_{A1}(-1)$ of the laser beam $L_{A1}$, at the reference mark 14A travel in parallel within the reference unit 12 as the heterodyne beam $L_C$, and then they are reflected at the bottom surface of the reference unit 12. Thereafter, they travel from the upper surface of the reference unit 12 in parallel with the incidence direction of the laser beam $L_{B1}$ and return to the projection optical system PL.

Returning to FIG. 6, the heterodyne beams $L_c$ and $L_D$ travel approximately in the reverse direction to the optical direction of the laser beams $L_{B1}$ and $L_{A2}$ which are incident onto the reference unit 12, and they transmit through the projection optical system PL and the mirror 24 and reach the ¼ wave plate 23. The heterodyne beams $L_C$ and $L_D$ are converted to linearly polarization light rotated through 90° relative to the angle at the time of incidence through the ¼ wave plate 23 and pass through the second relay lens 40. Then, they are reflected by the partial polarization beam splitter 39. Each of the beams $L_C$ and $L_D$ is incident onto the photoelectric sensor 25A and 25B. Subsequently, the first and second beat signals SA and SB obtained by photoelectric conversion of the heterodyne beams $L_C$ and $L_D$ are output from the photoelectric sensors 25A and 25B, respectively.

Thereafter, in this embodiment, the average of the phases of the first and second beat signals SA and SB is obtained using the phase of the reference beat signal SR as a standard. The lateral shifting quantity of the projected image is detected from the average of the phases of the first and second beat signals SA and SB. Moreover, the shifting quantity of the focus position of the image formation plane is detected from the phase difference of the these two beat signals SA and SB. Also, in this case, the lateral shifting quantity of the projected image as to the other reference mark 14B on the reference unit 12 is detected, whereby the variation quantity of the projection magnification can be obtained more precisely. Moreover, as in this embodiment, in case of the heterodyne interference method, since no mechanical movable portions are present, the variation quantity of the image formation characteristic can be obtained speedily with stability.

It is apparent that the present invention can be applied to measurement of the image formation characteristic with a projection exposure apparatus adopting the step-and-repeat type such as a stepper. Moreover, as a method to detect the reference mark 14A serving as the reference mark, the foregoing embodiment adopts the method to irradiate a plurality of coherent light beames. However, the detection of the reference mark may be allowed, for example, in the image processing method and the like. As described above, the present invention is not limited to the foregoing embodiment, and various changes, substitutions and alternations can be made therein without departing from sprit and scope of the present invention.

In the foregoing embodiments, the reference unit 12 with the reference mark 14A, 14B formed thereon is disposed between the projection optical system PL and the photosensitive substrate such as the wafer. The present invention is not limited to such constitution. For example, instead of the reference unit 12 with the reference mark 14A, 14B formed thereon, the reference unit 12 being disposed between the projection optical system PL and the wafer (photosensitive substrate), a reference unit 12' with a predetermined pattern (reference mark 14') of diffraction grating-shaped formed thereon is arranged on one terminal of a wafer stage 10. The optical characteristic of the projection optical system PL can be measured using both of the reference unit 12' formed on the wafer stage 10 and the measuring reference unit 17, 36 (see FIG. 1).

According to the image formation measuring apparatus of the present invention, since the substrate side reference unit and the measuring reference unit disposed at a separate position from the mask are used, the image formation measuring apparatus of the present invention offers advantages that it is capable of directly and continuously measuring the image formation characteristics such as a focus position and projection magnification of the projection optical system, without use of a substrate such as a mask and a wafer to be replaced during the exposure step.

In this case, the measuring optical system of the present invention is constituted such that the measuring optical system irradiates predetermined detection light onto the substrate side reference mark through the measuring reference unit and the projection optical system and receives at least one interference light generated in the substrate reference mark through the projection optical system. When the image formation characteristics of the projection optical system are corrected through the image formation characteristic correction means according to the image formation characteristics of the projection optical system which are measured based on the phase of at least one interference light received in the measuring optical system, the image formation characteristics of the projection optical system can be measured with a high precision using, for example, a homodyne interference method or a heterodyne interference method.

Furthermore, when the measuring optical system receives the two interference lights generated in the substrate side reference mark in the substrate side reference unit, obtains a shifting quantity of a focus position of the image formation plane of the projection optical system from the phase difference of these two interference lights and obtains a lateral shifting quantity of the projected image by the projection optical system from an average of the phases of the two interference lights, the measuring optical system offers advantages that it is capable of measuring a plurality of the image formation characteristics with a high precision only by detecting the phases of the two interference lights.

Furthermore, in the case where the measuring optical system is constituted such that it irradiates a plurality of diffracted lights onto the substrate side reference mark of the substrate side reference unit, the diffracted lights being generated from the measuring reference mark by irradiating predetermined detection light onto the measuring reference mark of the measuring reference unit and scanning means for scanning the plurality of the diffracted lights against the substrate side reference mark is provided, the measuring optical system offers advantages that the image formation characteristics can be measured with a high precision using the homodyne interference method.

Next, according to the exposure apparatus of the present invention, the exposure apparatus is capable of directly and continuously measuring the image formation characteristic of the projection optical system without the use of the substrate such as the mask and the photosensitive substrate to be replaced during the exposure step. The exposure apparatus of the present invention offers advantages that it can always transfer the mask pattern onto the photosensitive substrate through the projection optical system with a high precision.

In this case, the measuring optical system in the exposure apparatus is constituted so that after irradiation of the predetermined detection light onto the substrate side reference mark through the measuring reference unit and the projection optical system, at least one interference light generated in the substrate side reference mark is received through the projection optical system. When the image formation characteristic of the projection optical system is corrected through the image formation characteristic correction means according to the image formation characteristic of the projection optical system which is measured based on the phase of at least one interference light received by the measuring optical system, it is possible to measure the image formation characteristic of the projection optical system with a high precision using, for example, the homodyne interference method or the heterodyne interference method.

Another embodiment of the present invention will be described with reference to the accompanying drawings, below. This embodiment is an example in which the present invention is applied to the projection exposure apparatus adopting the step-and-scanning method for sequentially transferring the reticle pattern image onto each shot region by synchronously scanning the reticle or the wafer to the projection optical system, in the state where the reticle pattern as a mask is being projected on the wafer through the projection optical system. Moreover, in this embodiment, the measuring optical system adopting the heterodyne interference method is used as a part of the monitoring mechanism for monitoring the image formation characteristic.

Figure 9:
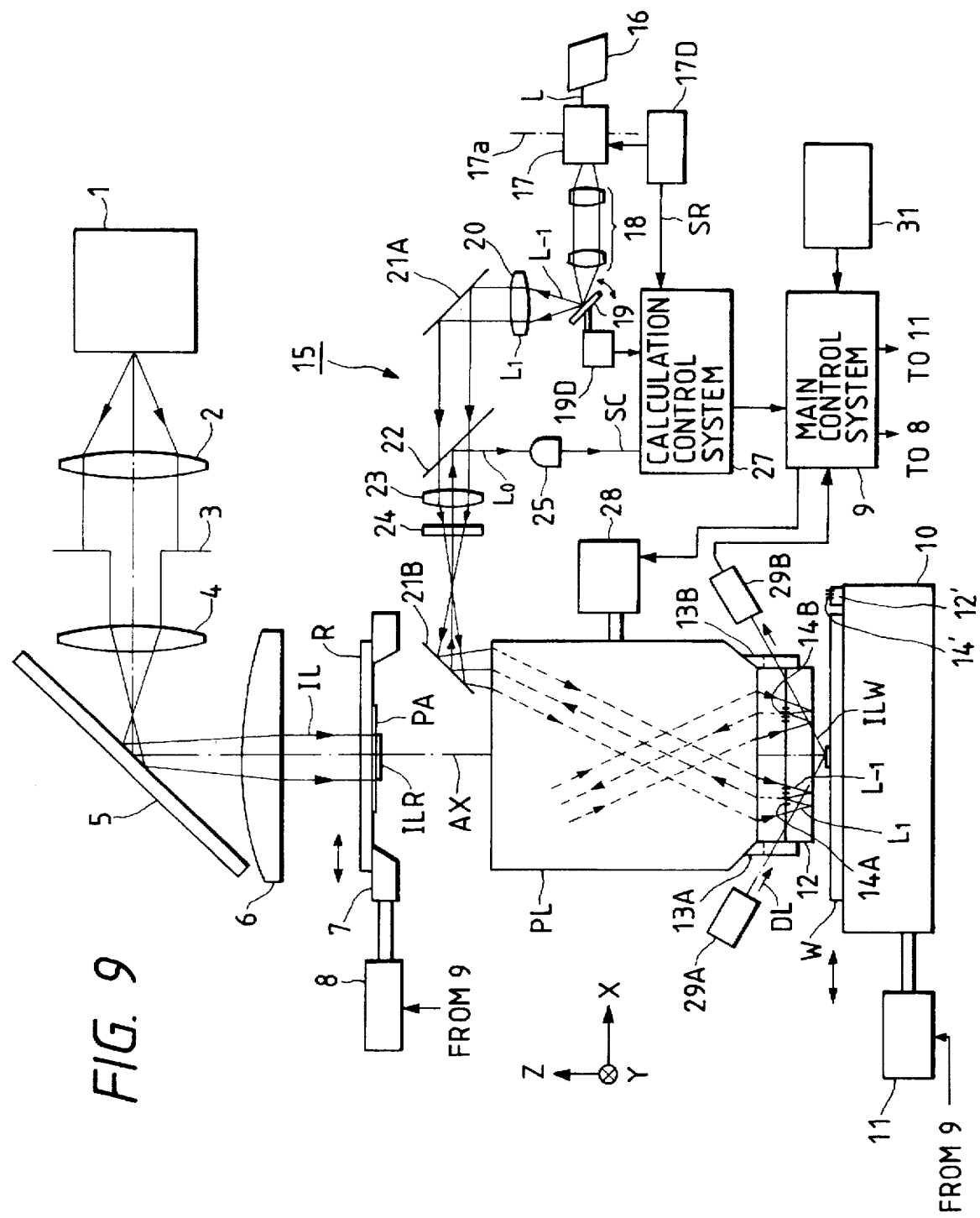
FIG. 9 is a schematic diagrammatic view showing a projection exposure apparatus of another embodiment of the present invention.

FIG. 9 shows a schematic constitution of the projection exposure apparatus of this embodiment, and the constitution of this embodiment is principally the same as that of FIG. 1. Explanations of the common parts are omitted.

The projection exposure apparatus of this embodiment is provided with the monitoring mechanism of the image formation characteristic for detecting the variation quantity of the focus position (best focus position) of the image formation plane of the projection optical system and the variation quantity of the projection magnification β. The constitution of the monitoring mechanism will be described below. First, in FIG. 9, the reference unit 12 in the monitoring mechanism on the side of the wafer is disposed between the projection optical system PL and the wafer W. The reference unit 12 formed of a light transmission glass substrate is fixed to the projection optical system PL through the supporting members 13A and 13B, and the reference marks 14A and 14B are formed on the upper surface 12a of the reference unit 12 on the side of the projection optical system PL, the reference marks 14A and 14B being in the X-direction and symmetrically disposed about the optical axis AX (see FIG. 10B).

Figure 10A:
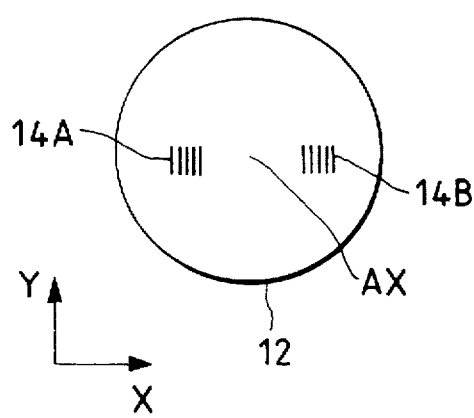
FIG. 10A is a plan view showing a reference unit 12 in FIG. 9.
Figure 10B:
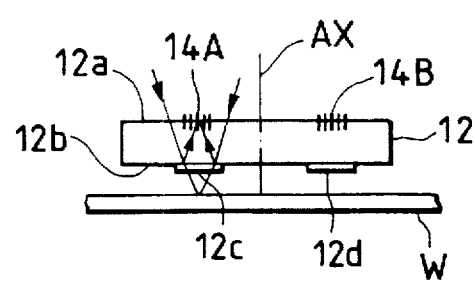
FIG. 10B is a side view showing the reference unit 12 in FIG. 9.

FIG. 10A is a plan view of the reference unit 12 and FIG. 10B is a side view thereof. As shown in FIG. 10A, the reference marks 14A and 14B are ones that are composed of phase type diffraction gratings formed at a predetermined pitch in the X-direction. Moreover, the reference marks 14A and 14B are also ones that are formed in a radius vector direction from the optical axis AX of the projection optical system PL, that is, in a meridional direction and are formed symmetrically about the optical axis AX at a predetermined pitch. The reference marks 14A and 14B can be formed by etching a metallic film such as chromium film deposited on a glass surface or by etching the glass surface itself. In this case, the exposure region on the wafer W in this embodiment has a width in the X-direction that is a narrow slit-shaped exposure region ILW, and an interval in the X-direction between the reference marks 14A and 14B is set so that imaging light beam of the illumination light hardly passes through the reference marks 14A and 14B. Therefore, the reference unit 12 has little effects on the projected image of the pattern of the reticle R. The imaging light beam of the illumination light IL are sometimes incident onto the reference marks 14A and 14B to some degree. The reference marks 14A and 14B actually have sizes so as to be neglected compared to that of the exposure region ILW, whereby the influence on the projected image can be neglected.

Furthermore, in this embodiment, the wavelength $\lambda_1$ of the detection light (laser beam L) for monitoring the image formation characteristic is set substantially equal to the wavelength $\lambda_0$ of the illumination light for exposing, as described later. Therefore, in FIG. 10B, the lower surface 12b of the reference unit 12 may be a half-mirror surface. However, in the case where the exposure region ILW is slit-shaped and the illumination light IL hardly passes through the vicinities of the irradiated portions 12c and 12d on the lower surface 12b of the reference unit 12, the detection light being irradiated on the portions 12c and 12d, only the irradiated portions 12c and 12d may be the mirror surface for reflecting the detection light.

Returning to FIG. 9, on the side surface portion of the projection optical system PL, there is provided with the measuring optical system 15 adopting the heterodyne interference method, which is included in the mechanism for monitoring the image formation characteristic of this embodiment. In this measuring optical system 15, laser beam L of the wavelength $\lambda_1$ as the detection light is emitted from the laser light source 16. In this embodiment, in order to precisely monitor the variation quantity of the image formation characteristic of the projection optical system PL under the illumination light IL, the wavelength $\lambda_1$ of the laser beam L is set substantially equal to the wavelength $\lambda_0$ of the illumination light IL. In this embodiment, since excimer laser light (wavelength: 248 nm, 193 nm is used as the illumination light IL, the same excimer laser light itself is, for example, used as the laser beam L. However, since the exicimer laser light is pulsed light so that it may make a signal processing system complicated, continuous laser beam of a wavelength close to that of the excimer laser light, for example, ultraviolet laser beam (wavelength: 244 nm, 257 nm etc.) which is high harmonic wave such as argon laser (oscillation wavelength: 488 nm, 514 nm etc. also may be used.

The linearly polarization laser beam L emitted from the laser light source 16 is incident onto the heterodyne beam generation optical system 17 as the measuring reference unit, which is in fixed positional relationship with the projection optical system PL. The heterodyne beam generation optical system 17 is an optical system which from the laser beam L incident thereto, generates a padifferent frnt light beames of different frequencies and emits them. The system 17 can be constituted by one acousto-optic modulator (hereinafter called an AOM) causing Raman-Nath diffraction most simply. However, since the drive frequency of the AOM is usually several tens MHz, beat frequency of the heterodyne beam obtained directly from the AOM is so high that a signal processing system is complicated. Therefore, in this embodiment, the heterodyne beam generation optical system 17 is constituted by disposing the two AOMs in series or in parallel, and the two AOMs are driven by driving signals from the AOM driving section 17D, each having frequency different from the other by several tens kHZ, whereby the beat frequency is reduced to a frequency region easy to handle. The coherent laser beams, each of which has different from the other and is emitted from the heterodyne beam generation optical system 17 as the detection light, are called a +1 order diffracted light $L_1$ and a −1 order diffracted light $L_{-1}$. Furthermore, the plane passing through the crossing (dividing point) of the diffracted lights $L_1$ and $L_{-1}$ in the heterodyne beam generation optical system 17 and is perpendicular to the optical axis, is called a reference plane 17a.

After the diffracted lights $L_1$ and $L_{-1}$ are emitted so as to diverse making a predetermined crossing angle, they are incident onto the surface of the oscillation mirror 19 through the relay optical system 18 so as to intersect it. Specifically, the surface of the oscillation mirror 19 and the crossing of the two light beames on the reference plane 17a in the heterodyne beam generation optical system 17 are set so as to be conjugated relative to the relay optical system 18. The oscillation mirror 19 is constituted so that it can rotate by a desired angle in forward and reverse directions around the axis perpendicular to the paper plane of FIG. 9 by the mirror driving section 19D. Scanning means of the detection light of the present invention is constituted by the oscillation mirror 19 and the driving section 19D.

The diffracted lights L1 and L−1 reflected by the oscillation mirror 19 pass through the first relay lens 20, whereby they become parallel light beams. Then, the light beams reach the mirror 21A. Subsequently, the light beames are incident onto the polarization beam splitter 22. The polarization directions of these two light beams are set to the direction (P polarization) where they transmit through the polarization beam splitter 22. After the diffracted lights $L_1$ and $L_{-1}$ transmit through the polarization beam splitter 22, they are collected by the second relay lens 23 and form interference fringes: an image of ultrasonic traveling wave in the AOMs of the heterodyne beam generating optical system 17. The interference fringes have been undergone the modulation of the position which oscillates in the pitch direction according to the beat frequency. Moreover, the ¼ wave plate 24 is disposed immediately after the second relay lens 24, and the diffracted lights $L_1$ and $L_{-1}$ are converted to a circularly polarized light.

The diffracted lights L1 and L-1 diverged from the interference fringes reach the optical path bending mirror 21B and are incident onto the projection optical system PL from the mirror 21B. Then, they pass through the projection optical system PL and are incident onto the reference unit 12 on the side of the wafer W. At this time, in consideration of the reflection on the reference unit 12, the surface of the oscillation mirror 19 and the upper surface of the reference unit 12 are made to be conjugated. Therefore, the reference plane 17a in the projection optical system PL and the upper surface of the reference unit 12 are conjugate.

Referring to FIG. 3A which is an enlarged view of the periphery of the reference mark 14A of the reference unit 12 on the side of the wafer, the diffracted lights $L_1$ and $L_{-1}$ incident onto the reference unit 12 transmit through the region on the upper surface 12a of the reference unit 12 and outside the reference mark 14A. Thereafter, the diffracted lights L1 and L-1 are reflected on the lower surface 12b of the reference unit 12 and incident onto the reference mark 14A at an incidence angle symmetrical to the X-direction. As a result, the interference fringes produced by the diffracted lights $L_1$ and $L_{-1}$ are formed on the reference mark 14A. Intensity distribution of the interference fringes varies like a flow depending on frequencies according to the beat frequency.

In this case, when let θ be an incidence angle of the diffracted lights L1 and L-1 relative to the reference mark 14A (crossing angle: θ); P, a pitch of the reference mark 14A; and λ, a wavelength of the diffracted lights Li and L-1 in the reference unit 12, the following relation holds.

$$P = \sin\theta/\lambda \quad (9)$$

Therefore, the interference light $L_C$ is generated vertically above, which is composed of the +1 order diffracted light caused created from the +1 order diffracted light $L_1$, and the −1 order diffracted light created from the −1 order diffracted light $L_{-1}$. This interference light $L_C$ returns to the projection optical system PL from the upper surface of the reference unit 12.

Furthermore, in the state where the surface of the wafer W is focused on the image formation plane of the projection optical system PL as shown in FIG. 3A, the point Q on the wafer W and the reference mark 14A on the upper surface 12a of the reference unit 12 are set so as to be conjugated each other under the diffracted lights $L_1$ and $L_{-1}$. Specifically, let t be the thickness of the reference unit 12; d, the interval between the lower surface 12b of the reference unit 12 and the wafer W; and n, the refractive index of the reference unit 12, thus, the following relationship holds.

$$d = t/n \quad (10)$$

Returning to FIG. 9, the interference light $L_C$ from the reference mark 14A travels approximately in the reverse direction to the optical paths between the diffracted lights $L_1$ and $L_{-1}$ incident onto the reference mark 14A and then travels through the projection optical system PL and the mirror 21. The interference light $L_C$ reaches the ¼ wave plate 24. The interference light $L_C$ which has been converted to the linearly polarization by being rotated by 90° from the angle at the time of incidence through the ¼ wave plate 24 passes through the second relay lens 23 and is reflected by the polarization beam splitter 22. Then, the interference light $L_C$ is incident onto the photoelectric sensor 25 formed of such as a photodiode. The measuring optical system 15 is constituted by the foregoing laser light sources 16 to the mirror 21B and the photoelectric sensor 25. The optical beat signal SC, which is obtained by photo-electrically converting the interference light $L_C$ by the photoelectric sensor 25, is supplied to the computation control system 27. The frequency of the optical beat signal SC is equal to the frequency difference of the diffracted lights $L_1$, and $L_{-1}$ (beat frequency). Furthermore, in the AOM driving section 17D of this embodiment, the reference beat signal SR which varies with the beat frequency is generated by mixing the two AOM driving signals in the heterodyne beam generating optical system 17. The reference beat signal SR is supplied to the computation control system 27.

Figure 11:
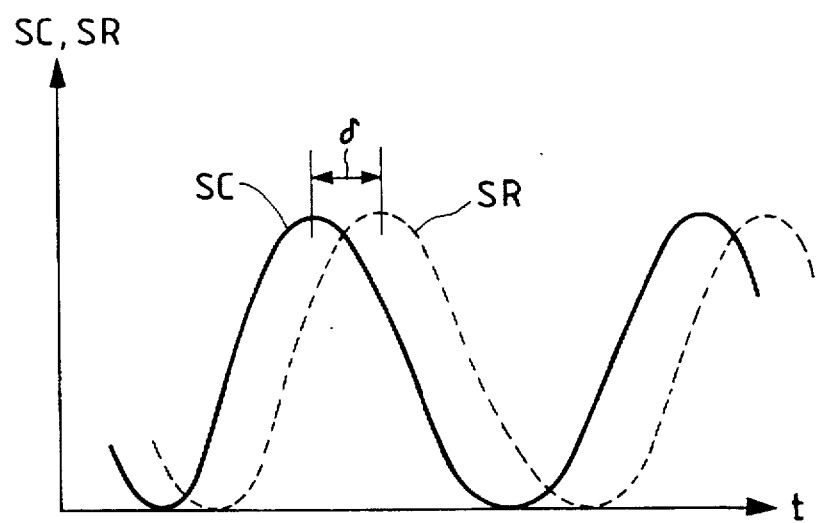
FIG. 11 are wave forms showing an optical beat signal SC provided from a photoelectric sensor 25 of FIG. 9 and a reference signal SR.

FIG. 11 shows the optical beat signal SC and the reference beat signal SR. Referring to FIG. 11, the optical beat signal SC and the reference beat signal SR vary, which illustrates the sine wave with the same beat frequency. In the computation control system 27, the phase difference δ of the beat signal SC is detected using the reference beat signal SR as a standard. Moreover, in the computation control system 27, the positional shifting quantity of the reference mark 14A on the reference unit 12 of FIG. 1 is obtained from the phase difference δ. In this case, the data concerning the rotation angle of the oscillation mirror 19 is supplied to the computation control system 27 from the mirror driving section 19D. In the computation control system 27, the shifting quantity of the focus position of the image formation plane of the projection optical system PL and the lateral shifting quantity of the projected image are obtained based on the data concerning the rotation angle of the oscillation mirror 19 and the positional shifting quantity of the reference mark 14A.

Furthermore, in FIG. 9, the second measuring optical system (not shown) which irradiates the two diffracted lights as the detection light onto the other reference mark 14A on the reference unit 12 is disposed symmetrically to the measuring optical system. The optical beat signal from the second measuring optical system is also supplied to the computation control system 27. At this time, it is desirable that light beam obtained by dividing the laser beam L from the laser light source 16 in the measuring optical system 15 should be used for the detection light used in the second measuring optical system. The computation control system 27 obtains the shifting quantity of the focus position of the image formation plane of the projection optical system PL and the lateral shifting quantity of the projected image, based on the optical beat signal from the second measuring optical system. Then, the computation control system 27 regards the average of the two shifting quantities of the focus position as the final shifting quantity of the focus position of the image formation plane and obtains the variation quantity of the projection magnification from the two lateral shifting quantities of the projected image. It should be noted that the variation quantity of the projection magnification can be obtained from only the lateral shifting quantity of the projected image obtained from the optical beat signal SC from one measuring optical system 15.

The final data concerning the shifting quantity of the focus position of the image formation plane and the variation quantity of the projection magnification is supplied to the main control system 9. The main control system 9 adds the offset in accordance with the shifting quantity of the focus signal to the focus signal generated in the light receiving optical system 29B, whereby the main control system 9 forces the wafer stage driving section 11 to focus the surface of the wafer W on the image formation plane after being varied and forces the lens controller 28 to correct the projection magnification of the projection optical system PL. Thus, if the focus position and the projection magnification of the projection optical system PL vary because of the atmospheric pressure change or irradiation of the illumination light IL, the pattern of the reticle R can be exposed onto each shot region of the wafer W, in the state where the surface of the wafer W is focused on the image formation plane and the projection magnification is kept at a predetermined value.

Next, a method to detect, from the optical beat signal SC, the shifting quantity of the focus position of the image formation plane and the lateral shifting quantity of the projected image in the computation control system 27 will be described with reference to FIGS. 12A, 12B and 13.

Figure 12A:
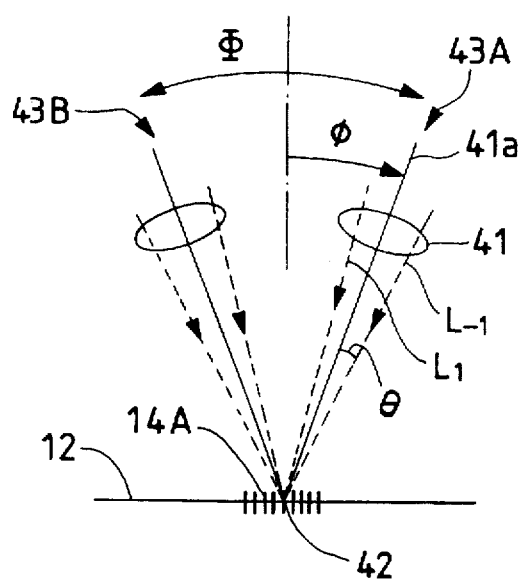
FIGS. 12A and 12B are schematic views for explaining angle scanning which is performed for a reference mark 14A centering a crossing 42.
Figure 12B:
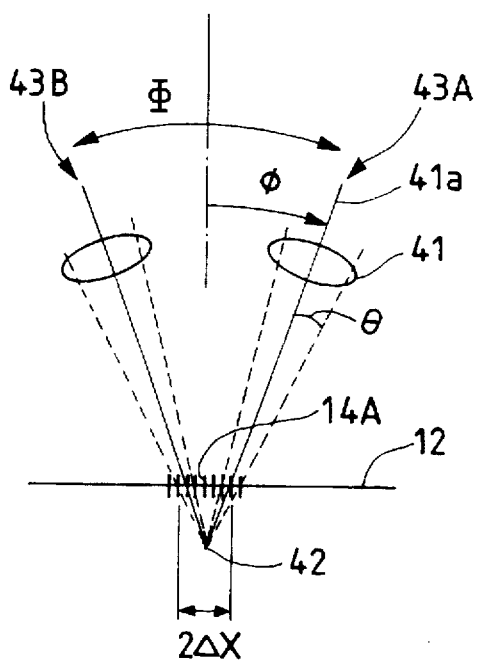

First, FIGS. 12A and 12B are schematic views for explaining angle scanning for the two diffracted lights $L_1$ and $L_{-1}$ performed by the oscillation mirror 19. The oscillation mirror 19 scans the two diffracted lights $L_1$ and $L_{-1}$ (hereinafter summarily called measuring light 41) in a forward and reverse rotation direction (a circle with center at the crossing 42 of the two diffracted lights $L_1$ and $L_{-1}$ is drawn in a Φ direction) In this embodiment, as shown in FIG. 12A, the crossing 42 of the measuring light 41 is set to the position where the crossing 42 is placed on the reference mark 14A on the reference unit 12 at beginning of the exposure, in the state where the image formation plane of the projection optical system PL is coincident with the plane where the focus signal from the focus position detection systems 29A and 29B become 0.

At the state of FIG. 12A, since the irradiation position of the measuring light 41 on the reference mark 14A makes no change even though the angular scanning of the measuring light 41 is performed in the Φ direction around the crossing 42 in order that the bisector 41a corresponding to the principal ray of the measuring light 41 moves from the position 43A to the position 43B, the measured positional shifting quantity of the reference mark 14A is not varied.

On the contrary, FIG. 12B shows the state where the focus position of the image formation plane of the projection optical system PL varies and the crossing 42 of the measuring light 41 shifts downward below the reference mark 14A. In the situation shown in FIG. 12B, when the angular scanning for the measuring light 41 is performed in the Φ direction centering the crossing 42 in order that the bisector 41a moves from the position 43A to the position 43B, the irradiation position of the measuring light 41 on the reference mark 14A gradually varies. Therefore, the measured positional shifting quantity of the reference mark 14A also varies by the width of 2ΔX.

In this case, it is assumed that the measured positional shifting quantity of the reference mark 14A is Δx when the bisector 41a of the measuring light 41 is scanned to the position 43A using the normal line to the formation plane of the reference mark 14A as a standard line, making the angle φ (hereinafter called scanning angle). The pitch P of the reference mark 14A is expressed in the formula (9) using the crossing angle 2θ and the wavelength λ. Therefore, using the phase difference δ between the optical beat signal SC from the photoelectric sensor 25 of FIG. 9 and the reference beat signal SR, the positional shifting quantity Δx of the reference mark 14A measured by the measuring light 41 is as follows.

$$\Delta x = \delta \cdot P/(4\pi) \tag{11}$$

Figure 13:
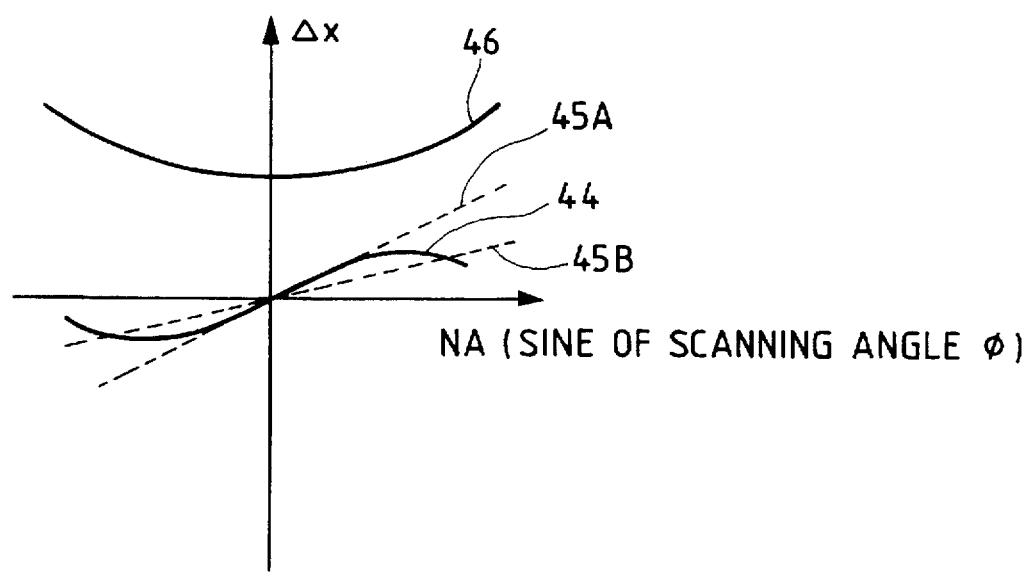
FIG. 13 is a diagram showing an example of the relation between a scanning angle $\phi$ and a position shifting $\Delta x$ measured for a reference mark 14A in FIGS. 12A and 12B.

The measuring solid curve 44 of FIG. 13 shows the positional shifting quantity of the reference mark 14A which is measured by the measuring light (diffracted light L1 and L-1) at the time when the scanning angle φ is varied described above. Since the scanning angle φ is also an exit angle of the measuring light 41 from the projection optical system PL, sine sin φ of the scanning angle φ corresponds to the numerical aperture NA of the projection optical system PL. The axis of abscissa of FIG. 13 shows the numerical aperture NA and the axis of ordinates shows the positional shifting quantity Δx measured by the measuring light 41 which is set to the numerical aperture NA.

As is understood from the FIG. 12B, when the crossing line 42 of the measuring light 41 is out of the reference mark 14A, the positional shifting quantity Δx at the time of the angular scanning of the measuring light 41 varies approximately in proportion to the scanning angle φ. Specifically, the slope of the tangent line 45A touching the measuring curve 44 at the origin will be in proportion to the variation quantity of the focus position of the image formation plane. Furthermore, when the measuring curve 44 shifts toward the axis of ordinates at the origin, this shifting quantity of the measuring curve 44 will mean the lateral shifting of the projected image or the magnification variation of the projection optical system PL. Therefore, by previously obtaining the proportion coefficient of the slope of the tangent line 45A to the variation quantity of the focus position, the variation quantity of the focus position of the image formation plane is computed from the slope of the tangent line 45A in the computation control system 27, and the lateral shifting quantity of the projected image is obtained from the shifting quantity of the measuring curve 44 at the origin toward the axis of ordinates. At this time, when the lateral shifting quantity of the projected image is also obtained from the measuring results of the other reference mark 14B of FIG. 9, the magnification error can be obtained from the difference between the two lateral shifting quantities, and the lateral shifting quantity of the projected image can be obtained from the average of the two lateral shifting quantities.

Furthermore, the slope of the measuring curve 44 of FIG. 13 corresponds to the variation quantity of the focus position obtained with serious consideration for data concerning the vicinity of the center of the numerical aperture NA of the projected optical system PL. Compared to this, the slope of the straight line 45B connecting the origin to the end portion of the measuring curve 44 corresponds to the variation quantity of the average focus position obtained in consideration of also the end portion of the numerical aperture NA. For example, when there are many thick lines in the transferring pattern on the reticle R, the central portion of the numerical aperture NA of the projection optical system PL is principally used. Therefore, it is desirable to measure the variation quantity of the focus position from the tangent line 45A. On the other hand, when there are many thin lines in the transfer pattern, the higher portion of the numerical aperture NA of the projection optical system PL is important. Therefore, the straight line 45B may be used.

As described above, in this embodiment, since the data concerning the variation quantity can be obtained over a wide range of the numerical aperture NA, the variation quantity of the proper focus position can be measured according to such as the width of the transferring pattern lines and illumination conditions. These factors may be applicable to the case where the magnification variation of the projection optical system PL is measured. As described above, even when the measurement is carried out over wide range of the numerical aperture NA, it suffices that only a pair of the common reference marks 14A and 14B are used. Therefore, the constitution is simplified.

Furthermore, the measuring curve 44 of FIG. 13 is obtained as a result of the measurement for many angular scanning positions, that is, over wide range of the numerical aperture NA. However, the measuring curve obtained by measuring less angular scanning positions, that is, the angular scanning positions of the specific numerical aperture NA, may be used. For example, when the so called modification illumination is performed, the variation quantity of the image formation characteristic can be precisely obtained by using data concerning the corresponding portion in the numerical aperture NA of the projection optical system PL.

Since the measuring curve of FIG. 13 is the same as the so called aberration curve, the aberration measurement of the projection optical system PL can be carried out using the aberration curve. In concrete terms, the projection optical system PL inherently involves, for example, comatic aberration, the positional shifting quantity Δx against the scanning angle φ varies as the quadratic curve similar to the measuring curve 16 of FIG. 13. The quantity of the comatic aberration of the projection optical system PL can be measured based on the measuring curve 46. In addition, at the time when the measurement of the comatic aberration is conducted in the above described manner, an image rotator or the like for rotating the measuring light around the optical axis AX of the projection optical system PL is arranged between the projection optical system PL and the measuring optical system 15, in order that the measuring curve is obtained by plotting a plurality of points around the optical axis AX. Thus, the more precise data concerning the image formation characteristic can be obtained.

As described above, it turns out that the variation quantities of the focus position and the projection magnification can be precisely detected by this embodiment. Thereafter, as has been described, the correction for the projection magnification of the projection optical system PL is conducted by the lens controller 28 based on these detection measurements, and the correction for the focus position is conducted by the wafer stage driving system 11. Thus, the pattern image of the reticle R can be precisely transferred onto each shot region of the wafer W with a high superposition precision.

At this time, in this embodiment, one photoelectric sensor 25 is used in the measuring optical system 15, so that the constitution of the apparatus is simplified. In addition, since only a pair of the interference lights $L_C$ from the reference mark 14A is detected, mixing of the interference lights is little so that the position detection can be conducted precisely. Unless a duty ratio of the reference mark 14A is 50%, the second order diffracted light is generated from the reference mark 14A. Since only the ± order diffracted light from the reference mark 14A may be detected in this embodiment, such deleterious second order diffracted light can be easily shielded with a spatial filter or the like. Therefore, this embodiment offers advantages that manufacturing of the reference mark 14A is easy and the measurement of the image formation characteristic can be conducted with a high precision without influences by noise light.

In the foregoing embodiment, the laser light source 16 of the same oscillation wavelength as the exposure wavelength is used as the light source in the measuring optical system PL. As shown in FIG. 3A, the upper surface 12a of the reference unit 12 on the wafer side is set so as to be conjugated with the surface of the wafer.

On the contrary, light beam of the wavelength different from the exposure wavelength like He-Ne laser light of the wavelength 633 nm may be used as the detection light for the measurement of the image formation characteristic. In this case, since the chromatic aberration of the detection light for measuring the image formation characteristic is produced in the projection optical system PL, the reference mark 14A must be set to the conjugate point with the surface of the oscillation mirror 19, in consideration of the production of the chromatic aberration. Thus, though the upper surface 12a of the reference unit 12 on the wafer side will not be conjugated with the surface of the wafer W, no disadvantages particularly occur.

Though no conjugate relation with the surface of the wafer W is brought about, formation of the reference mark 14A on the under surface 12b of the reference unit 12 makes the constitution of the apparatus simple. Moreover, in FIG. 9, the reference mark 14A can be also formed on a portion of one surface of a predetermined lens in the projection optical system PL. In addition, in the foregoing embodiment, the reference unit 12 is formed of the single glass substrate. However, the reference unit 12 may be formed of two parallel plates or the like.

In FIG. 9, the light beat signal SC is compared with the reference beat signal SR which is electrically generated. Two light beames of the different wavelength generated in the heterodyne beam generation optical system 17 are partially branched and the branchedportion is irradiated onto a reference lattice. Interference light composed of diffracted light obtained from this reference lattice is subjected to a photoelectric conversion so that an optical beat signal is obtained. Instead of the reference signal SR, this optical beat signal may be used as the reference signal.

It is apparent that the present invention is applicable to measurement of the image formation characteristic with a projection exposure apparatus adopting the step-and-repeat method, such as a stepper. In addition, in the foregoing embodiment, the heterodyneiinterference method for irradiating a plurality of coherent light beames is employed as the detection method of the reference mark 14A. The present invention is applicable to the homodyne interference method, that is, the detection method wherein static interference fringes are projected and the variation quantity of the relative position of the reference mark to the interference fringes is detected by image processing.

In the embodiment of FIG. 9, the oscillation mirror 19 and the driving section 19D are used as the scanning means. However, an angular scanning of the measuring light may be opto-electrically performed using an acousto-optic element or the like. Thus, the angular scanning of the measuring light can be stably and speedily performed without mechanical operations.

As described above, the present invention is not limited to the foregoing embodiment, and various constitution can be made therein without departing from spirit and scope of the inventions as defined by the appended claims.

In the foregoing embodiment, the reference unit 12 having the reference marks 14A and 14B is arranged between the projection optical system PL and the photosensitive substrate such as the wafer. However, the present invention is not limited thereto. For example, instead of the reference unit arranged between the projection optical system PL and the wafer (photosensitive substrate), which has the reference marks 14A and 14B, the reference unit 12' having the predetermined pattern of diffraction grating-shaped (reference mark 14') is disposed on one terminal of the wafer stage 10. The optical characteristics of the projection optical system can be measured using the measuring reference unit 17 and the reference unit 12' which is formed on the wafer stage 10 (see FIG. 9).

According to the image formation characteristic measuring apparatus of the present invention, since the image formation characteristics of the projection optical system are measured using the measuring reference unit located at the position separate from the mask and the substrate side reference unit, the substrate such as the mask and the photosensitive substrate, which is to be replaced with new one during the exposure step, is not used, and the measurements of the image formation characteristics such as the focus position and the projection magnification of the projection optical system can be directly and continuously conducted. Moreover, since angular scanning for the light beam from the measuring reference unit is performed within the effective aperture (the numerical aperture), the image formation characteristics can be measured precisely, even when the substantial numerical aperture of the image formation light beam from the projection optical system varies according to the width of the transferring pattern line.

At this time, the width of the angular scanning, which is conducted, using the angular scanning means, for the light beam from the measuring reference unit, is adjusted according to the resolution required for the projection optical system, whereby the image formation characteristic according to the resolution of the projection optical system can be measured precisely.

The measuring optical system of the present invention is the one that irradiates the detection light, which has been subjected to the angular scanning by the angular scanning means after passing through the measuring reference unit, onto the substrate side reference mark through the projection optical system, and receives a pair or a plurality of the detection lights generated in the substrate side reference mark. In the case where the image formation characteristic of the projection optical system is measured based on these received detection lights, the image formation characteristics can be measured using the detected light with a simplified constitution.

In the case where using the detection light which passes through the measuring reference unit and is set to a plurality of different angular states by the angular scanning means, the position of the substrate side reference mark is detected through the measuring optical system, and further the image formation characteristic of the projection optical system is measured based on the detection results, the defocus quantity of the image formation plane of the projection optical system can be measured. At the same time, the image formation under the large numerical aperture can be measured.

Next, according to the exposure apparatus of the present invention, there are provided with the image formation characteristic measurement apparatus composed of the substrate side reference unit, the measuring reference unit, the angular scanning means, and the measuring optical system, whereby the image formation characteristic can be precisely measured even when the substantial numerical aperture of the image formation light beam from the projection optical system varies.

At this time, in the case where the measuring optical system is the one that irradiates the detection light, which has been subjected to the angular scanning by the angular scanning means after passing through the measuring reference unit, onto the substrate side reference mark through theprojectionoptical systemand receives a pair or a plurality of the detection lights generated in the substrate side reference mark, and the image formation characteristic correction means for correcting the image formation characteristic of the projection optical system based on the detection result of the measuring optical system is further provided, the image formation characteristic correction means corrects the image formation characteristic so as to cancel the variation quantity of the image formation characteristic measured by the image formation characteristic measuring apparatus, whereby the image formation characteristic can always be maintained at a proper state.

What is claimed is:

1. An image formation characteristic measuring apparatus of a projection optical system for projecting an original pattern image formed on a mask onto a photosensitive substrate comprising:

a reference unit on which a reference mark is formed, said reference unit being disposed between said projection optical system and said substrate;

a measuring reference unit on which a measuring reference mark is formed, said measuring reference mark being disposed on a predetermined reference surface at a position separate from said mask; and a measuring optical system for detecting said reference mark through said measuring reference unit and said projection optical system using a predetermined detection light, in order to measure an image formation characteristic of said projection optical system.

2. The image formation characteristic measuring apparatus according to claim 1, wherein said measuring optical system irradiates the predetermined detection light onto said reference mark through said measuring reference unit and said projection optical system, receives at least one interference light generated by said reference mark, and measures the image formation characteristic of said projection optical system based on at least one interference light which is received therein.

3. The image formation characteristic measuring apparatus according to claim 2, wherein said measuring optical system receives the interference light generated in said reference mark on said reference unit, a focus position shifting quantity of an image formation plane of said projection optical system is obtained based on a phase difference between said two interference lights, and a lateral shifting quantity of a projected image formed by said projection optical system is obtained based on an average of said two interference lights.

4. The image formation characteristic measuring apparatus according to claim 2, wherein said measuring optical system irradiates a predetermined detection light onto said measuring reference mark on said measuring reference unit, thereby irradiating a plurality of diffracted lights generated from said reference measuring reference mark onto said mark, and a scanning device for scanning said diffracted lights to said reference mark is provided.

5. The image formation characteristic measuring apparatus according to claim 1, wherein said measuring optical system is for a homodyne interference method.

6. The image formation characteristic measuring apparatus according to claim 1, wherein said measuring optical system is for a heterodyne interference method.

7. An exposure apparatus which projects an original pattern image formed on a mask onto a photosensitive substrate through a projection optical system, comprising:

a reference unit on which a reference mark is formed, said reference unit being disposed between said projection optical system and said substrate;

a measuring reference unit on which a measuring reference mark is formed, said measuring reference mark being disposed on a predetermined reference surface at a position separate from said mask;

a measuring optical system for detecting said reference mark through said measuring reference unit and said projection optical system using a predetermined detection light, in order to measure an image formation characteristic of said projection optical system; and an image formation characteristic correction device which corrects an image formation characteristic of said projection optical system based on a detection result of said measuring optical system.

8. The exposure apparatus according to claim 7, wherein said measuring optical system irradiates a predetermined detection light onto said reference mark through said measuring reference unit and said projection optical system and, subsequently, receives at least one interference light generated in said reference mark, and said image formation characteristic correction device corrects an image formation characteristic of said projection optical system in accordance with the image formation characteristic of said projection optical system which is measured based on a phase of the interference light received by said measuring optical system.

9. The exposure apparatus according to claim 7, wherein said measuring optical system is for a homodyne interference method.

10. The exposure apparatus according to claim 7, wherein said measuring optical system is for a heterodyne interference method.

11. An image formation characteristic measuring apparatus of a projection optical system for projecting an original pattern image formed on a mask onto a photosensitive substrate comprising:

a reference unit on which a reference mark is formed, said reference unit being disposed between said projection optical system and said substrate;

a measuring reference unit disposed on a predetermined reference surface at a position separate from said mask;

an angular scanning device for performing an angular scanning for a light from said measuring reference unit within an effective aperture of said projection optical system; and a measuring optical system for detecting said reference mark through said projection optical system using a detection light which has been subjected to the angular scanning by said angular scanning device after passing through said measuring reference unit, in order to measure an image formation characteristic of said projection optical system.

12. The image formation characteristic measuring apparatus according to claim 11, wherein a width of the angular scanning for the light from said measuring reference unit is adjusted by said angular scanning device, according to resolution required for said projection optical system.

13. The image formation characteristic measuring apparatus according to claim 11, wherein said measuring optical system irradiates the detection light onto said reference unit through said projection optical system, said detection light having been subjected to the angular scanning by said angular scanning device after passing through said measuring reference unit and receives at least one pair of the detection lights generated in said reference mark, and an image formation characteristic of said projection optical system is measured based on said received detection lights.

14. The image formation characteristic measuring apparatus according to claim 11, wherein a position of said reference unit is detected through said measuring optical system using a plurality of the detection lights which are set to different angular states by said angular scanning device after passing through said measuring reference unit, and an image formation characteristic is measured based on said detection result.

15. The image formation characteristic measuring apparatus according to claim 11, wherein said measuring optical system is for a homodyne interference method.

16. The image formation characteristic measuring apparatus according to claim 11, wherein said measuring optical system is for a heterodyne interference method.

17. An exposure apparatus which projects an original pattern image formed on a mask onto a photosensitive substrate through a projection optical system, comprising:

a reference unit on which a reference mark is formed, said reference unit being disposed between said projection optical system and said substrate;

a measuring reference unit disposed on a predetermined reference surface at a position separate from said mask;

an angular scanning device which performs an angular scanning forlight from said measuring reference unit within an effective aperture of said projection optical system; and a measuring optical system for detecting said reference mark through said projection optical system using the detection light which has been subjected to the angular scanning by said angular scanning device after passing through said measuring reference unit, in order to measure an image formation characteristic of said projection optical system.

18. The exposure apparatus according to claim 17, wherein said measuring optical system irradiates the detection light onto said reference unit through said projection optical system, said detection light having been subjected to the angular scanning by said angular scanning device after passing through said measuring reference unit and receives at least one pair of the detection lights generated in said reference mark, and an image formation characteristic of said projection optical system is corrected based on a detection result of said measuring optical system.

19. The exposure apparatus according to claim 17, wherein said measuring optical system is for a homodyne interference method.

20. The exposure apparatus according to claim 7, wherein said measuring optical system is for a heterodyne interference method.

21. An exposure apparatus which projects an original pattern image formed on a mask onto a photosensitive substrate, comprising:

a substrate stage which hold said substrate;

a first reference unit on which a first reference mark is formed, said first reference unit being disposed between said projection optical system and said substrate stage;

a second reference unit on which a second reference mark is formed, said second reference unit being disposed on a predetermined surface at a position separate from said mask;

a measuring optical system which detects said first reference mark through said second reference unit and said projection optical system using a predetermined detection light, in order to measure an image formation characteristic of said projection optical system; and an image formation characteristic correction device which corrects the image formation characteristic of said projection optical system based on a detection result of said measuring optical system.

22. An exposure apparatus which projects an original pattern image formed on a mask onto a photosensitive substrate, comprising:

a substrate stage which hold said substrate;

a first reference unit onwhich a first reference mark is formed, said first reference unit being disposed between said projection optical system and said substrate stage;

a second reference unit disposed on a predetermined surface at a position separate from said mask;

an angular scanning device which performs an angular scanning for light from said second reference unit within an effective aperture of said projection optical system; and a measuring optical system which detects said first reference mark through said projection optical system using the detection light which has been subjected to the angular scanning by said angular scanning device after passing through said second reference unit, in order to measure an image formation characteristic of said projection optical system.

23. The exposure apparatus according to claim 21, wherein said first reference unit is disposed between said projection optical system and said substrate.

24. The exposure apparatus according to claim 21, wherein said first reference unit is arranged on said substrate stage.

25. The exposure apparatus according to claim 22, wherein said first reference unit is disposed between said projection optical system and said substrate.

26. The exposure apparatus according to claim 22, wherein said first reference unit is arranged on said substrate stage.

* * * * *